(12) United States Patent
Wu et al.

(10) Patent No.: US 10,443,125 B2
(45) Date of Patent: Oct. 15, 2019

(54) FLOURINATION PROCESS TO CREATE SACRIFICIAL OXY-FLOURIDE LAYER

(71) Applicant: Applied Materials, Inc., Santa Clara, CA (US)

(72) Inventors: Xiaowei Wu, San Jose, CA (US); David Fenwick, Los Altos Hills, CA (US); Guodong Zhan, Dhahran (SA); Jennifer Y. Sun, Mountain View, CA (US); Michael R. Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/965,812

(22) Filed: Apr. 27, 2018

(65) Prior Publication Data
US 2018/0327898 A1 Nov. 15, 2018

Related U.S. Application Data

(60) Provisional application No. 62/504,470, filed on May 10, 2017.

(51) Int. Cl.
C23C 4/11 (2016.01)
C23C 16/28 (2006.01)
(Continued)

(52) U.S. Cl.
CPC ............... C23C 16/28 (2013.01); C23C 4/11 (2016.01); C23C 4/134 (2016.01); C23C 4/18 (2013.01);
(Continued)

(58) Field of Classification Search
CPC . C23C 14/081; C23C 14/221; C23C 14/5826; C23C 14/5846; C23C 16/28; C23C 16/403; C23C 16/405; C23C 16/452; C23C 16/45525; C23C 16/45536; C23C 16/56; C23C 28/04; C23C 28/042; C23C 28/42; C23C 4/11; C23C 4/134;
(Continued)

(56) References Cited

U.S. PATENT DOCUMENTS 5,069,938 A * 12/1991 Lorimer .................... C23C 8/34
148/276
6,548,424 B2 4/2003 Putkonen
(Continued)

FOREIGN PATENT DOCUMENTS

CN 104701125 6/2015
JP 4283925 A 8/2000
(Continued)

OTHER PUBLICATIONS

U.S. Appl. No. 15/965,810, Metal Oxy-Flouride Films for Chamber Components, filed Apr. 27, 2018.
(Continued)

Primary Examiner — Lan Vinh
(74) Attorney, Agent, or Firm — Lowenstein Sandler LLP

(57) ABSTRACT

An article comprises a body having a coating. The coating comprises a Y—O—F coating or other yttrium-based oxyfluoride coating generated either by performing a fluorination process on a yttrium-based oxide coating or an oxidation process on a yttrium-based fluorine coating.

18 Claims, 16 Drawing Sheets

(51) Int. Cl.
  *H01J 37/32* (2006.01)
  *C23C 16/452* (2006.01)
  *C23C 16/40* (2006.01)
  *C23C 16/455* (2006.01)
  *C23C 4/134* (2016.01)
  *C23C 4/18* (2006.01)
  *C23C 14/08* (2006.01)
  *C23C 14/22* (2006.01)
  *C23C 14/58* (2006.01)
  *C23C 16/56* (2006.01)
  *C23C 28/04* (2006.01)
  *C23C 28/00* (2006.01)
  *C23C 16/30* (2006.01)
  *C23C 16/44* (2006.01)

(52) U.S. Cl.
  CPC .......... *C23C 14/081* (2013.01); *C23C 14/221* (2013.01); *C23C 14/5826* (2013.01); *C23C 14/5846* (2013.01); *C23C 16/30* (2013.01); *C23C 16/403* (2013.01); *C23C 16/405* (2013.01); *C23C 16/4404* (2013.01); *C23C 16/452* (2013.01); *C23C 16/45525* (2013.01); *C23C 16/45536* (2013.01); *C23C 16/45555* (2013.01); *C23C 16/56* (2013.01); *C23C 28/04* (2013.01); *C23C 28/042* (2013.01); *C23C 28/42* (2013.01); *H01J 37/32357* (2013.01); *H01J 37/32908* (2013.01); *H01J 37/32963* (2013.01); *H01J 2237/332* (2013.01); *H01J 2237/334* (2013.01)

(58) Field of Classification Search
  CPC ....... C23C 4/18; C23C 16/30; C23C 16/4404; C23C 16/45555; H01J 2237/332; H01J 2237/334; H01J 37/32357; H01J 37/32908; H01J 37/32963
  USPC .............. 216/37, 38, 67, 71, 73, 75, 77, 80; 438/758, 762, 770
  See application file for complete search history.

(56) References Cited

U.S. PATENT DOCUMENTS

| | | | |
|---|---|---|---|
| 6,777,353 B2 | 8/2004 | Putkonen |
| 6,783,875 B2 | 8/2004 | Yamada et al. |
| 6,798,519 B2 | 9/2004 | Nishimoto et al. |
| 6,806,949 B2 | 10/2004 | Ludviksson et al. |
| 6,858,546 B2 | 2/2005 | Niinisto et al. |
| 6,916,534 B2 | 7/2005 | Wataya et al. |
| 7,137,353 B2 | 11/2006 | Saigusa et al. |
| 7,147,749 B2 | 12/2006 | Nishimoto et al. |
| 7,163,585 B2 | 1/2007 | Nishimoto et al. |
| 7,204,912 B2 | 4/2007 | Saigusa et al. |
| 7,208,044 B2 | 4/2007 | Zurbuchen |
| 7,291,566 B2 | 11/2007 | Escher et al. |
| 7,351,658 B2 | 4/2008 | Putkonen |
| 7,461,614 B2 | 12/2008 | Fink et al. |
| 7,462,407 B2 | 12/2008 | Maeda et al. |
| 7,498,272 B2 | 3/2009 | Niinisto et al. |
| 7,552,521 B2 | 6/2009 | Fink |
| 7,560,376 B2 | 7/2009 | Escher et al. |
| 7,678,226 B2 | 3/2010 | Saigusa et al. |
| 7,696,117 B2 | 4/2010 | Sun et al. |
| 7,713,640 B2 | 5/2010 | Zurbuchen |
| 7,732,067 B2 | 6/2010 | Zurbuchen |
| 7,744,780 B2 | 6/2010 | Kobayashi et al. |
| 7,754,621 B2 | 7/2010 | Putkonen |
| 7,780,786 B2 | 8/2010 | Mitsuhashi et al. |
| 7,811,428 B2 | 10/2010 | Nishimoto et al. |
| 7,833,924 B2 | 11/2010 | Kobayashi et al. |
| 7,915,189 B2 | 3/2011 | Kobayashi et al. |
| 7,998,307 B2 | 8/2011 | Chen et al. |
| 7,998,883 B2 | 8/2011 | Putkonen |
| 8,043,971 B2 | 10/2011 | Sasaki et al. |
| 8,117,986 B2 | 2/2012 | Saigusa et al. |
| 8,163,403 B2 | 4/2012 | Zurbuchen |
| 8,449,715 B2 | 5/2013 | Mitsuhashi et al. |
| 8,858,745 B2 | 10/2014 | Sun et al. |
| 8,877,002 B2 | 11/2014 | Mitsuhashi et al. |
| 8,896,210 B2 | 11/2014 | Nishino et al. |
| 9,017,765 B2 | 4/2015 | Sun et al. |
| 2001/0003271 A1 | 6/2001 | Otsuki |
| 2005/0098106 A1 | 5/2005 | Fink et al. |
| 2005/0103275 A1 | 5/2005 | Sasaki et al. |
| 2005/0193951 A1 | 9/2005 | Furuse et al. |
| 2005/0199183 A1 | 9/2005 | Arai et al. |
| 2007/0215278 A1 | 9/2007 | Furuse et al. |
| 2008/0236744 A1 | 10/2008 | Furuse et al. |
| 2008/0314321 A1 | 12/2008 | Furuse et al. |
| 2009/0025751 A1* | 1/2009 | Wang ................... C23C 16/4404 134/3 |
| 2009/0151870 A1 | 6/2009 | Urakawa et al. |
| 2009/0183835 A1 | 7/2009 | Furuse et al. |
| 2009/0214825 A1 | 8/2009 | Sun et al. |
| 2010/0119844 A1 | 5/2010 | Sun et al. |
| 2010/0129670 A1 | 5/2010 | Sun et al. |
| 2010/0140222 A1 | 6/2010 | Sun et al. |
| 2010/0247930 A1 | 9/2010 | Zurbuchen |
| 2011/0100298 A1* | 5/2011 | David ................... C08J 9/36 118/723 E |
| 2013/0115418 A1 | 5/2013 | Young-Dohe et al. |
| 2014/0099491 A1* | 4/2014 | Ameen ................ C23C 14/0021 428/220 |
| 2014/0116338 A1 | 5/2014 | He et al. |
| 2014/0118880 A1 | 5/2014 | He et al. |
| 2014/0120312 A1 | 5/2014 | He et al. |
| 2015/0004418 A1 | 1/2015 | Sun et al. |
| 2015/0096462 A1 | 4/2015 | Fukagawa et al. |
| 2015/0126036 A1 | 5/2015 | Zhao |
| 2015/0143677 A1 | 5/2015 | Sun et al. |
| 2015/0361540 A1 | 12/2015 | Hamaya et al. |
| 2016/0254125 A1 | 9/2016 | Huang et al. |
| 2016/0273095 A1* | 9/2016 | Lin ........................ C23C 14/48 |
| 2016/0276141 A1 | 9/2016 | Sun et al. |
| 2016/0307740 A1 | 10/2016 | Kim et al. |
| 2016/0326058 A1 | 11/2016 | Nagayama et al. |
| 2017/0018408 A1 | 1/2017 | Xu et al. |
| 2017/0029628 A1 | 2/2017 | Takai et al. |
| 2017/0040146 A1 | 2/2017 | Huang et al. |
| 2017/0088928 A1 | 3/2017 | Ibe et al. |
| 2017/0107604 A1 | 4/2017 | Ibe et al. |
| 2017/0110293 A1 | 4/2017 | Sun et al. |
| 2017/0114440 A1 | 4/2017 | Takai et al. |
| 2018/0016193 A1 | 1/2018 | Fukagawa et al. |
| 2018/0127318 A1 | 5/2018 | Nagayama et al. |

FOREIGN PATENT DOCUMENTS

| | | |
|---|---|---|
| JP | 2015110844 | 6/2015 |
| JP | 2016089241 | 5/2016 |
| JP | 2016153369 | 8/2016 |
| JP | 2017061737 | 3/2017 |
| JP | 2017061738 | 3/2017 |
| JP | 2017071843 | 4/2017 |

OTHER PUBLICATIONS

U.S. Appl. No. 15/965,813, Metal Oxy-Flouride Films Based on Oxidation of Metal Flourides, filed Apr. 27, 2018.

* cited by examiner

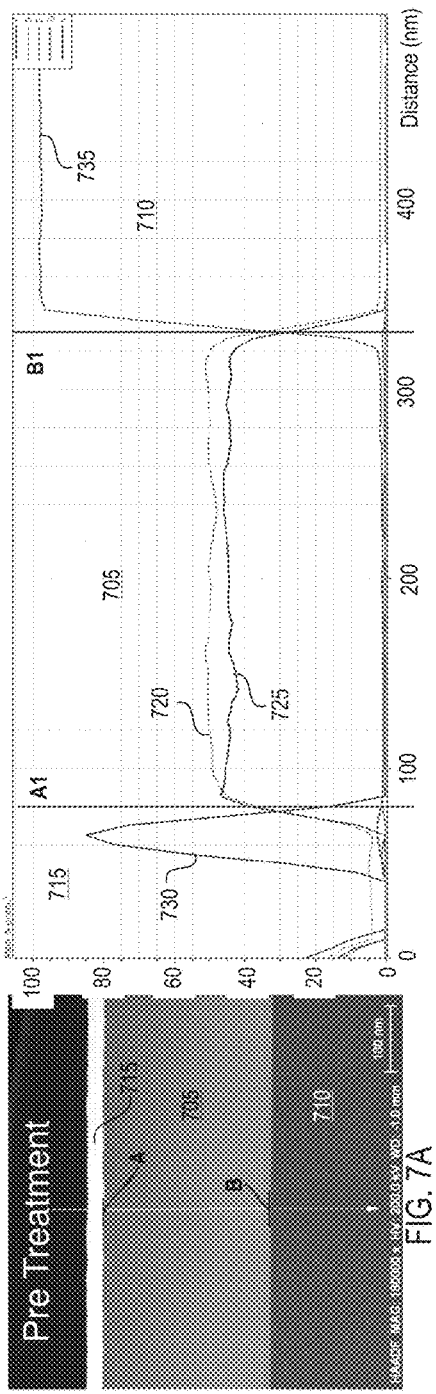
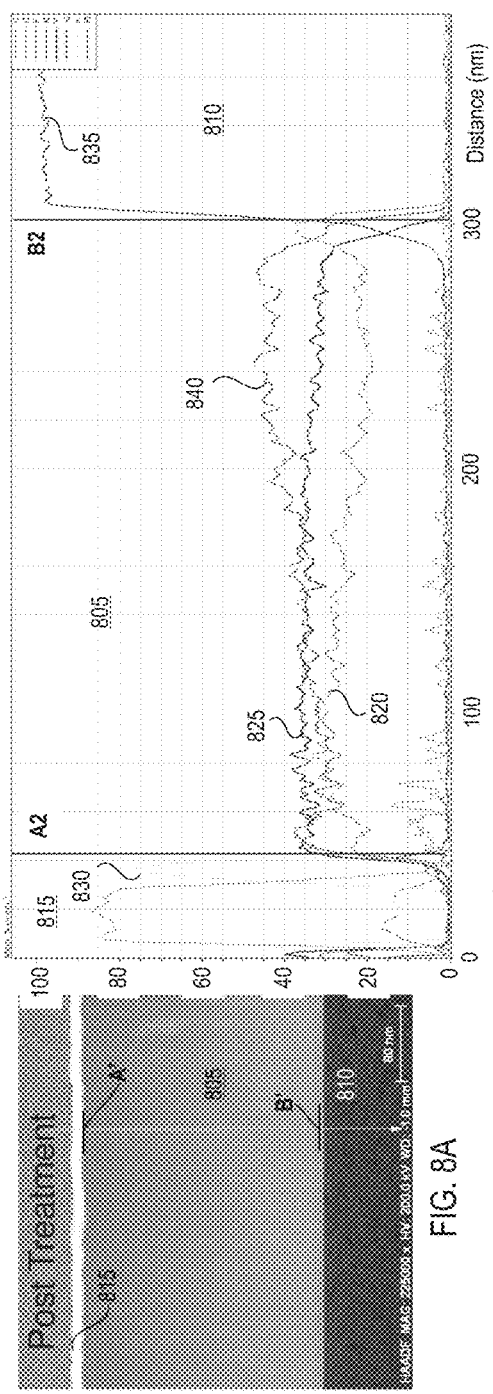
FIG. 7A    FIG. 7B
FIG. 8A    FIG. 8B

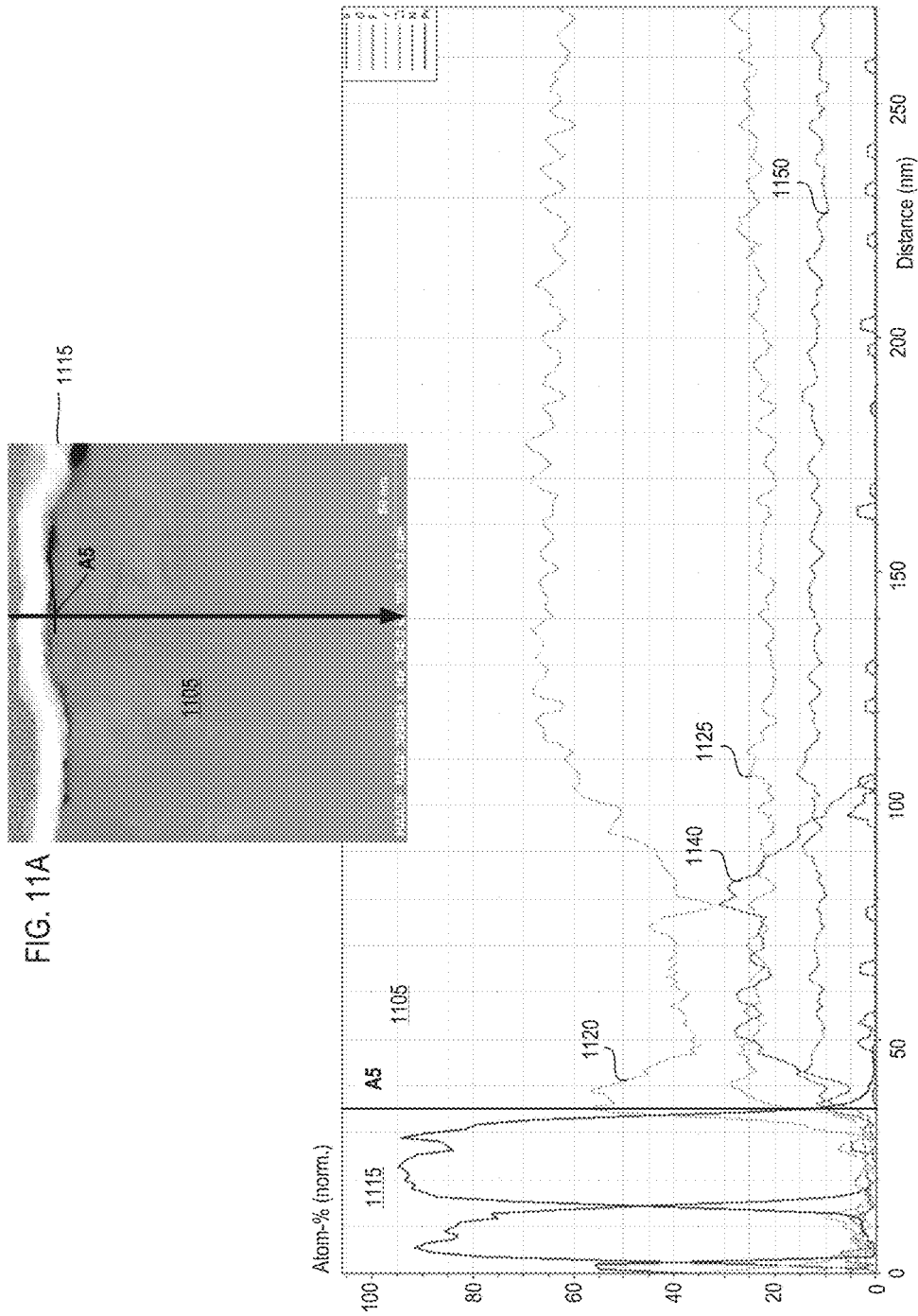

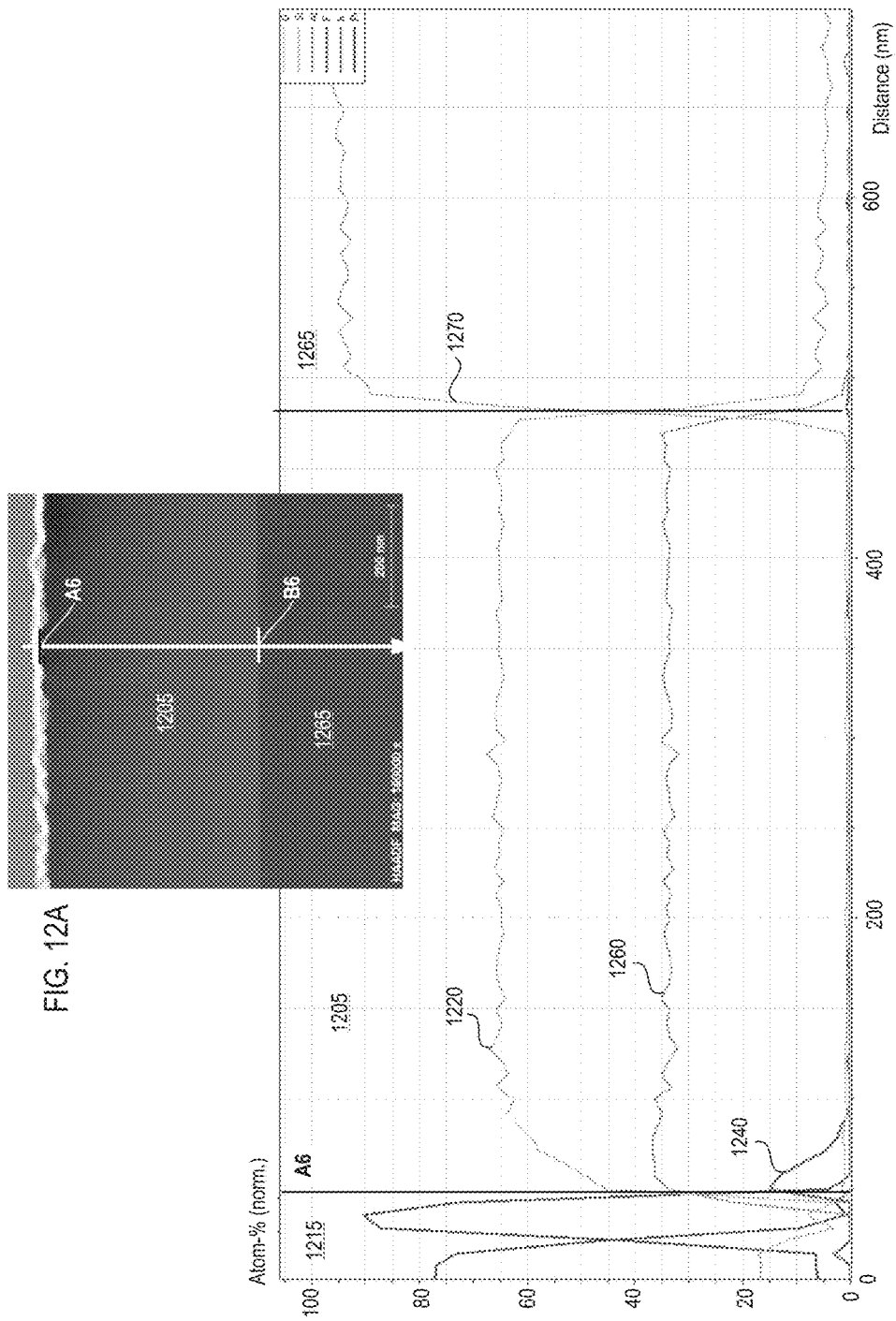

FLOURINATION PROCESS TO CREATE SACRIFICIAL OXY-FLOURIDE LAYER

RELATED APPLICATIONS

This patent application claims the benefit under 35 U.S.C. § 119(e) of U.S. Provisional Application No. 62/504,470, filed May 10, 2017, which is incorporated by reference herein.

TECHNICAL FIELD

Embodiments of the present disclosure relate, in general, to methods of converting metal fluoride and/or metal oxide coatings into M-O—F layers and coatings. Embodiments additionally relate to in-situ formation of temporary metal fluoride and/or M-O—F layers over metal oxide surfaces.

BACKGROUND

Various manufacturing processes expose chamber components and their coating materials to high temperatures, high energy plasma, a mixture of corrosive gases, high stress, and combinations thereof. Rare earth oxides are frequently used in chamber component manufacturing due to their resistance to erosion from plasma etch chemistries. However, exposure of rare earth oxides to fluorine based plasma can cause cracking and shedding of particles onto wafers.

Furthermore, oxide coatings such as $Y_2O_3$ are permeable to water and can cause the adsorption of water. As a result, exposure of oxide coatings such as $Y_2O_3$ coatings to air generally causes a brittle M(OH) layer (e.g., a $Y(OH)_3$ layer) to form at a surface of the oxide coating, where M is a metal. Tests have shown the presence of multiple —OH groups at the surface of $Y_2O_3$ coatings exposed to air. The M(OH) layer is brittle and can shed particles onto processed wafers. Additionally, the M(OH) layer causes increased leakage current in the metal oxide coating (e.g., in the $Y_2O_3$ coating).

In some instances $YF_3$ has been used as a coating for chamber components. Use of the $YF_3$ coating can mitigate the issue of yttrium based particles on processed wafers. However, applying a $YF_3$ coating to chamber components of an etch reactor has been shown to cause a significant etch rate drop (e.g., an etch rate drop of as much as 60%), process drift and chamber matching issues.

SUMMARY

In an example implementation of a first method for forming a Y—O—F layer or coating, a yttrium-containing coating (e.g., a $Y_2O_3$ coating or $Y_2O_3$—$ZrO_2$ solid solution coating) is deposited on a surface of a chamber component for a first processing chamber. Alternatively a $M_xO_y$ coating may be deposited, where M is a metal such as Al or a rare earth metal. The chamber component is heated to an elevated temperature of about 150-1000° C. (e.g., 150-500° C.). The chamber component is exposed to a fluorine source such as HF, $NF_3$, $NF_3$ plasma, $F_2$, F radicals, etc. at the elevated temperature for a duration of time. As a result, at least a surface of the yttrium-containing oxide coating is converted into a Y—O—F layer or other yttrium-based oxy-fluoride layer or coating. In some instances, an entirety of the yttrium-containing oxide coating is converted to Y—O—F or other yttrium containing oxy-fluoride. Alternatively, at least a surface of the $M_xO_y$ coating is converted to a M-O—F layer.

In an example implementation of a second method for forming a Y—O—F layer or coating, atomic layer deposition (ALD), chemical vapor deposition (CVD) or ion assisted deposition (IAD) is performed to deposit a $YF_3$ coating having a thickness of about 10 nm to about 10 microns onto a surface of a chamber component for a processing chamber. The chamber component is heated to an elevated temperature of about 150-1500° C. The chamber component is exposed to an oxygen source at the elevated temperature for a duration of about 12-24 hours. As a result, the $YF_3$ coating is converted into a Y—O—F coating.

In an example implementation of a third method for forming a M-O—F layer or coating, a substrate is loaded into a processing chamber, the processing chamber comprising one or more chamber components that include a metal oxide coating. A fluorine-based plasma from a remote plasma source is introduced into the processing chamber. The metal oxide coating is reacted with the fluorine-based plasma to form a temporary M-O—F layer or metal fluoride layer over the metal oxide coating. A process that utilizes a corrosive gas is then performed on the substrate. The process removes or adds to the temporary M-O—F layer or metal fluoride layer, but the temporary M-O—F layer or metal fluoride layer protects the metal oxide coating from the corrosive gas.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 7A illustrates a cross sectional side view of a chamber component that includes a $Y_2O_3$ coating as viewed by a transmission electron microscope (TEM), according to an embodiment.

FIG. 7B illustrates a material composition of the chamber component of FIG. 7A.

FIG. 8A illustrates a cross sectional side view of a chamber component that includes a Y—O—F coating after a fluorination process as viewed by a TEM, according to an embodiment.

FIG. 8B illustrates a material composition of the chamber component of FIG. 8A.

FIG. 11A illustrates a cross sectional side view of a chamber component that includes a solid sintered (bulk) ceramic composed of a $Y_2O_3$—$ZrO_2$ solid solution after a fluorination process as viewed by a TEM, according to an embodiment.

FIG. 11B illustrates a material composition of the chamber component of FIG. 11A.

FIG. 12A illustrates a cross sectional side view of a chamber component that includes a coating of $Al_2O_3$ after a fluorination process as viewed by a TEM, according to an embodiment.

FIG. 12B illustrates a material composition of the chamber component of FIG. 12A.

DETAILED DESCRIPTION OF EMBODIMENTS

Figure 1:
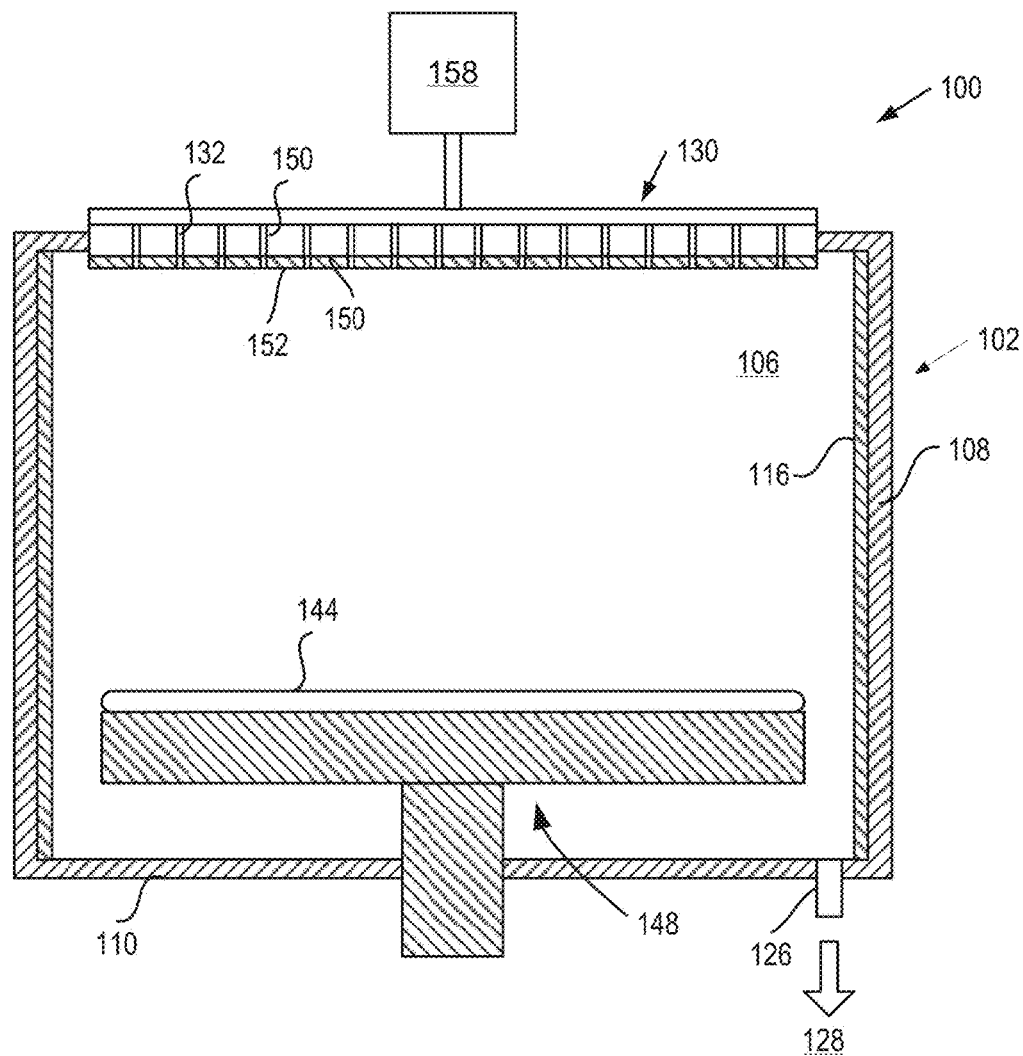
FIG. 1 depicts a sectional view of one embodiment of a processing chamber.

Embodiments of the invention are directed to processes for forming Y—O—F layers and coatings as well as other M-O—F layers and coatings, where M is a metal such as Al, a rare earth or a combination of multiple metals. Y—O—F coatings and layers and other yttrium-containing oxy-fluoride coatings and layers are highly resistant to erosion and corrosion by fluorine-based plasmas. Additionally, M-O—F coatings are generally resistant to fluorination by fluorine-based plasmas. Additionally, M-O—F coatings may be resistant to formation of M(OH) such as $Y(OH)_3$. Moreover, M-O—F coatings do not cause the etch rate reductions that have been observed when $YF_3$ is used to coat chamber components. As a result of these properties, Y—O—F and other M-O—F coatings and layers as described herein offer significant reduction in particles and also improve etch rate uniformity and chamber to chamber uniformity when used on chamber components for processing chambers. In embodiments, the nomenclature "M-O—F" means 1-99 at. % M, 1-99 at. % O and 1-99 at. % F.

In some embodiments, a metal oxide coating is formed via atmospheric pressure plasma spray (APPS), low pressure plasma spray (LPPS), suspension plasma spray (SPS), ion assisted deposition (IAD), chemical vapor deposition (CVD), atomic layer deposition (ALD) or another deposition technique. The metal oxide coating may be expressed as $M_xO_y$, where M is a metal such as Al or a rare earth metal, and x and y are positive numerical values (e.g., positive integers from 1-9). In some examples, the metal oxide coating may be $Al_2O_3$ or a rare earth oxide such as $Gd_2O_3$, $Yb_2O_3$, $Er_2O_3$ or $Y_2O_3$. The metal oxide coating may also be more complex oxides such as $Y_3Al_5O_{12}$ (YAG), $Y_4Al_2O_9$ (YAM), $Y_2O_3$ stabilized $ZrO_2$ (YSZ), $Er_3Al_5O_{12}$ (EAG), a $Y_2O_3$—$ZrO_2$ solid solution, or a composite ceramic comprising $Y_4Al_2O_9$ and a solid solution of $Y_2O_3$—$ZrO_2$. At least a surface of the metal oxide coating is converted to M-O—F by exposing the metal oxide coating to a fluorine source such as HF, $NF_3$, $F_2$, $NF_3$ plasma, F radicals, etc. at an elevated temperature for a time period. The time period may be about 0.1-72 hours (e.g., about 1-24) hours in some embodiments.

Thin dense coatings such as those deposited using IAD and ALD are susceptible to cracking when deposited over articles having a coefficient of thermal expansion (CTE) that is different from a CTE of the thin dense coating. Unlike thick and porous plasma sprayed yttrium-based coatings, thin dense yttrium-based coatings are not tolerable of tensile stress. Tensile stress often causes through cracks in thin dense yttrium-based coatings that offer highly reactive species a direct passage to attack an underlying coated surface during processing. For example, $Y_2O_3$ has a CTE of around 6-8 ppm/K (also expressed as $\times 10^{-6}$/° C., ppm/° C. and $\times 10^{-6}$/K, all of which are equivalent), $YF_3$ has a CTE of around 14 ppm/K, and aluminum has a CTE of about 22-25 ppm/K. The mismatch in CTE between the aluminum article and the $Y_2O_3$ or $YF_3$ coatings can cause the dense coatings of $YF_3$ and $Y_2O_3$ on aluminum to crack at process temperatures (e.g., of around 250-350° C.) due to tensile stress caused by the mismatch in CTE. In some instances, the cracking can be mitigated by heating the article during the deposition of the thin dense yttrium-based coating. However, some deposition processes such as ALD should be performed in a particular range of temperatures that may be lower than a range of process temperatures at which the article will be used. Accordingly, it may not be feasible to increase the deposition temperature for the yttrium-based coating.

$YF_3$ has a molar volume that is about 60% larger than the molar volume of $Y_2O_3$. For example, $YF_3$ has a molar volume of 36.384 cm³/mol and $Y_2O_3$ has a molar volume of about 22.5359 cm³/mol. Y—O—F has a molar volume that is between the molar volumes of $Y_2O_3$ and $YF_3$. As a result, there is a volume expansion of up to about 60% when $Y_2O_3$ converts to $YF_3$, and a lesser volume expansion when $Y_2O_3$ converts to Y—O—F. In embodiments, a fluorination process is performed on a yttrium-based oxide coating to convert at least a portion of the yttrium-based coating into a Y—O—F coating or layer, as discussed above. Due to the larger molar volume of Y—O—F as compared to $Y_2O_3$, the conversion of the yttrium-based oxide coating to a Y—O—F coating or layer introduces compressive stress to the coating at room temperature. The added compressive stress at room temperature translates to a lesser tensile stress at process temperatures of (e.g., of around 250-350° C.). The reduced tensile stress at process temperatures can reduce or eliminate cracking of the thin dense yttrium-based coating.

In some embodiments, a $YF_3$ or other yttrium-based fluoride coating is formed via ion assisted deposition (IAD), atomic layer deposition (ALD), CVD or another deposition technique. The $YF_3$ coating or other yttrium-based fluoride coating is converted to Y—O—F or M-O—F by exposing the metal oxide coating to an oxygen source at an elevated temperature for a time period.

In some embodiments, the $YF_3$ coating or other yttrium-based fluoride coating is formed on an article having a lower CTE than $YF_3$ or the other yttrium-based fluoride coating. For example, the $YF_3$ or the other yttrium-based fluoride coating may be formed on a graphite article having a CTE of around 4 ppm/K. The conversion of the $YF_3$ coating to a Y—O—F coating (or other yttrium-based fluoride coating to a M-O—F coating where M is a combination of Y and another metal) can cause the molar volume of the coating to reduce, which can reduce the compressive stress in the coating at room temperature and at process temperatures. This can reduce cracking during thermal cycling caused by the CTE mismatch.

In some embodiments, an in-situ fluorination process is performed to form a thin M-O—F layer (e.g., a thin Y—O—F layer or a thin Y—Z—O—F layer) or a thin metal fluoride layer (e.g., a thin $YF_3$ layer) at the surface of a metal oxide coating on one or more chamber components prior to performing a manufacturing process on a substrate. For example, the in-situ fluorination process may be performed prior to a plasma etch process or a plasma cleaning process. The fluorination process may include introducing a fluorine-based plasma from a remote plasma source into a processing chamber that includes the one or more chamber components. The fluorine-based plasma may be introduced using process parameter values that are optimal for formation of a thin M-O—F or metal fluoride layer and that are different from the parameters of the manufacturing process that will be subsequently performed. The metal oxide coating is reacted with the fluorine-based plasma to form a temporary M-O—F layer or metal fluoride layer over the metal oxide coating. The manufacturing process that utilizes a corrosive gas (e.g., a fluorine-based plasma or a reducing chemistry such as an ammonia based chemistry or a chlorine based chemistry) is then performed on the substrate. The manufacturing process may remove the temporary M-O—F layer or metal fluoride layer or may add to the temporary M-O—F layer or metal fluoride layer depending on the manufacturing process, but the temporary M-O—F layer or metal fluoride layer protects the metal oxide coating from the corrosive gas.

In another embodiment, the in-situ fluorination process may include exposing one or more chamber components of the processing chamber to a fluorine-based acid solution (e.g., an HF acid solution and/or $NH_4F$ acid solution). For example, a fluorine-based acid solution may be used to perform fluorination for non-vacuum chambers such as chambers for chemical mechanical planarization (CMP) or wet clean benches. The fluorine-based acid solution may be introduced using process parameter values that are optimal for formation of a thin M-O—F or metal fluoride layer. The metal oxide coating is reacted with the fluorine-based plasma to form a temporary M-O—F layer or metal fluoride layer over the metal oxide coating. The manufacturing process that utilizes a corrosive gas (e.g., a fluorine-based plasma or a reducing chemistry such as an ammonia based chemistry or a chlorine based chemistry) is then performed on the substrate. The manufacturing process may remove the temporary M-O—F layer or metal fluoride layer or may add to the temporary M-O—F layer or metal fluoride layer depending on the manufacturing process, but the temporary M-O—F layer or metal fluoride layer protects the metal oxide coating from the corrosive gas.

In some embodiments an etch back process is performed periodically to remove at least a portion of the temporary M-O—F layer or metal fluoride layer from the metal oxide coating. The etch back may be used to ensure that a thickness of the M-O—F layer or metal fluoride layer does not reach a threshold thickness. Beyond the threshold thickness, the M-O—F layer or metal fluoride layer may begin shedding particles due to added stress caused by volume expansion from the conversion of metal oxide to M-O—F or metal fluoride. However, below the threshold thickness particle adders may be mitigated or prevented.

The term "heat treating" is used herein to mean applying an elevated temperature to a ceramic article, such as by a furnace. "Plasma resistant material" refers to a material that is resistant to erosion and corrosion due to exposure to plasma processing conditions. The plasma processing conditions include a plasma generated from halogen-containing gases, such as $C_2F_6$, $SF_6$, $SiCl_4$, HBR, $NF_3$, $CF_4$, $CHF_3$, $CH_2F_2$, F, $Cl_2$, $CCl_4$, $BCl_3$ and $SiF_4$, among others, and other gases such as $O_2$, or $N_2O$. The resistance of the material to plasma is measured through "etch rate" (ER), which may have units of Angstrom/min (Å/min), throughout the duration of the coated components' operation and exposure to plasma. Plasma resistance may also be measured through an erosion rate having the units of nanometer/radio frequency hour (nm/RFHr), where one RFHr represents one hour of processing in plasma processing conditions. Measurements may be taken after different processing times. For example, measurements may be taken before processing, after 50 processing hours, after 150 processing hours, after 200 processing hours, and so on. An erosion rate lower than about 100 nm/RFHr is typical for a plasma resistant coating material. A single plasma resistant material may have multiple different plasma resistance or erosion rate values. For example, a plasma resistant material may have a first plasma resistance or erosion rate associated with a first type of plasma and a second plasma resistance or erosion rate associated with a second type of plasma.

When the terms "about" and "approximately" are used herein, these are intended to mean that the nominal value presented is precise within ±10%. Some embodiments are described herein with reference to chamber components and other articles installed in plasma etchers for semiconductor manufacturing. However, it should be understood that such plasma etchers may also be used to manufacture micro-electro-mechanical systems (MEMS)) devices. Additionally, the articles described herein may be other structures that are exposed to plasma or other corrosive environments. Articles discussed herein may be chamber components for processing chambers such as semiconductor processing chambers. For example, the articles may be chamber components for a plasma etcher, a plasma cleaner, a plasma propulsion system, or other processing chambers. Examples of chamber components that may benefit from embodiments of the invention include a substrate support assembly, an electrostatic chuck (ESC), a ring (e.g., a process kit ring or single ring), a chamber wall, a base, a gas distribution plate, a face plate, a showerhead, a nozzle, a lid, a liner, a liner kit, a shield, a plasma screen, a flow equalizer, a cooling base, a chamber viewport, a chamber lid, and so on.

Moreover, embodiments are described herein with reference to M-O—F layers and coatings that cause reduced particle contamination when used in a process chamber for plasma rich processes. However, it should be understood that the M-O—F layers and coatings discussed herein may also provide reduced particle contamination when used in process chambers for other processes such as non-plasma etchers, non-plasma cleaners, chemical vapor deposition (CVD) chambers physical vapor deposition (PVD) chambers, plasma enhanced chemical vapor deposition (PECVD) chambers, plasma enhanced physical vapor deposition (PEPVD) chambers, plasma enhanced atomic layer deposition (PEALD) chambers, and so forth. Additionally, the techniques discussed herein with regards to formation of M-O—F layers and coatings are also applicable to articles other than chamber components for processing chambers.

Moreover, embodiments are described herein with reference to converting metal fluoride coatings (e.g., yttrium-based fluoride coatings) and metal oxide coatings (or portions of such coatings) into Y—O—F layers and other M-O—F layers. However, it should be understood that embodiments also apply to conversion of the surfaces of bulk metal oxides into M-O—F. For example, the surface of a sintered $Y_2O_3$ ceramic article may be converted into Y—O—F by the processes described with reference to FIGS. 3A and 5 below.

Moreover, some embodiments are discussed with reference to yttrium based oxides and/or yttrium based fluorides. Erbium is completely miscible with yttrium. Accordingly, it should be understood that these embodiments may be modified with similar results by replacing any amount of the yttrium with erbium. Accordingly, yttrium may be substituted with erbium in any of the embodiments discussed herein with regards to yttrium based fluorides, yttrium based oxides and yttrium based oxy-fluorides. Some of the yttrium may be substituted with erbium, or all of the yttrium may be substituted with erbium in embodiments. Accordingly, any of the embodiments discussed herein may replace between 0% and 100% of the recited yttrium with erbium. In an example, rather than $Y_2O_3$, a coating may instead be a mixture of 1-99 mol % $Y_2O_3$ and 1-99 mol % $Er_2O_3$. The resulting metal oxy-fluoride may then be Y—Er—O—F in which the ratio of Y to Er is anywhere from 1:99 to 99:1.

FIG. 1 is a sectional view of a processing chamber 100 (e.g., a semiconductor processing chamber) having one or more chamber components that include a M-O—F layer or coating in accordance with embodiments of the present invention. The processing chamber 100 may be used for processes in which a corrosive plasma environment is provided. For example, the processing chamber 100 may be a chamber for a plasma etch reactor (also known as a plasma etcher), a plasma cleaner, and so forth. Examples of chamber components that may include a M-O—F layer or coating are a substrate support assembly 148, an electrostatic chuck (ESC), a ring (e.g., a process kit ring or single ring), a chamber wall, a base, a showerhead 130, a gas distribution plate, a liner, a liner kit, a shield, a plasma screen, a flow equalizer, a cooling base, a chamber viewport, a chamber lid, a nozzle, process kit rings, and so on.

In one embodiment, the processing chamber 100 includes a chamber body 102 and a showerhead 130 that enclose an interior volume 106. The showerhead 130 may or may not include a gas distribution plate. For example, the showerhead may be a multi-piece showerhead that includes a showerhead base and a showerhead gas distribution plate bonded to the showerhead base. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110.

An outer liner 116 may be disposed adjacent the sidewalls 108 to protect the chamber body 102. The outer liner 116 may be a halogen-containing gas resist material such as $Al_2O_3$ or $Y_2O_3$.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewalls 108 of the chamber body 102 and/or on a top portion of the chamber body. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 includes multiple gas delivery holes 132 throughout the showerhead 130. The showerhead 130 may by aluminum, anodized aluminum, an aluminum alloy (e.g., Al 6061), or an anodized aluminum alloy. In some embodiments, the showerhead includes a gas distribution plate (GDP) bonded to the showerhead. The GDP may be, for example, Si or SiC. The GDP may additionally include multiple holes that line up with the holes in the showerhead.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A substrate support assembly 148 is disposed in the interior volume 106 of the processing chamber 100 below the showerhead 130. The substrate support assembly 148 holds a substrate 144 (e.g., a wafer) during processing. The substrate support assembly 148 may include an electrostatic chuck that secures the substrate 144 during processing, a metal cooling plate bonded to the electrostatic chuck, and/or one or more additional components. An inner liner (not shown) may cover a periphery of the substrate support assembly 148. The inner liner may be a halogen-containing gas resist material such as $Al_2O_3$ or $Y_2O_3$.

Any of the showerhead 130 (or lid and/or nozzle), sidewalls 108, bottom 110, substrate support assembly 148, outer liner 116, inner liner (not shown), or other chamber component may include a M-O—F coating or a metal oxide coating with a M—O—F layer on the metal oxide coating, in accordance with embodiments. For example, as shown showerhead 130 includes a M—O—F coating 152. In some embodiments, a M—O—F layer is temporarily formed using an in-situ fluorination process prior to performing another process on the substrate 144. In some embodiments, the M—O—F coating 152 is a Y—O—F coating. The Y—O—F coating may have a single Y—O—F phase or multiple different Y—O—F phases. Some possible Y—O—F phases that the Y—O—F coating may have are YOF ht, YOF rt, YOF tet, $Y_2OF_4$ (e.g., $Y_2OF_4$ ht-hp), $Y_3O_2F_5$ (e.g., $Y_3O_2F_5$ ht-hp), $YO_{0.4}F_{22}$ (e.g., $YO_{0.4}F_{22}$ht-hp), $Y_5O_4F_7$, $Y_6O_5F_8$, $Y_7O_6F_9$, and $Y_{17}O_{14}F_{23}$. In some embodiments, the M—O—F coating is a Y—Zr—O—F coating.

Figure 2:
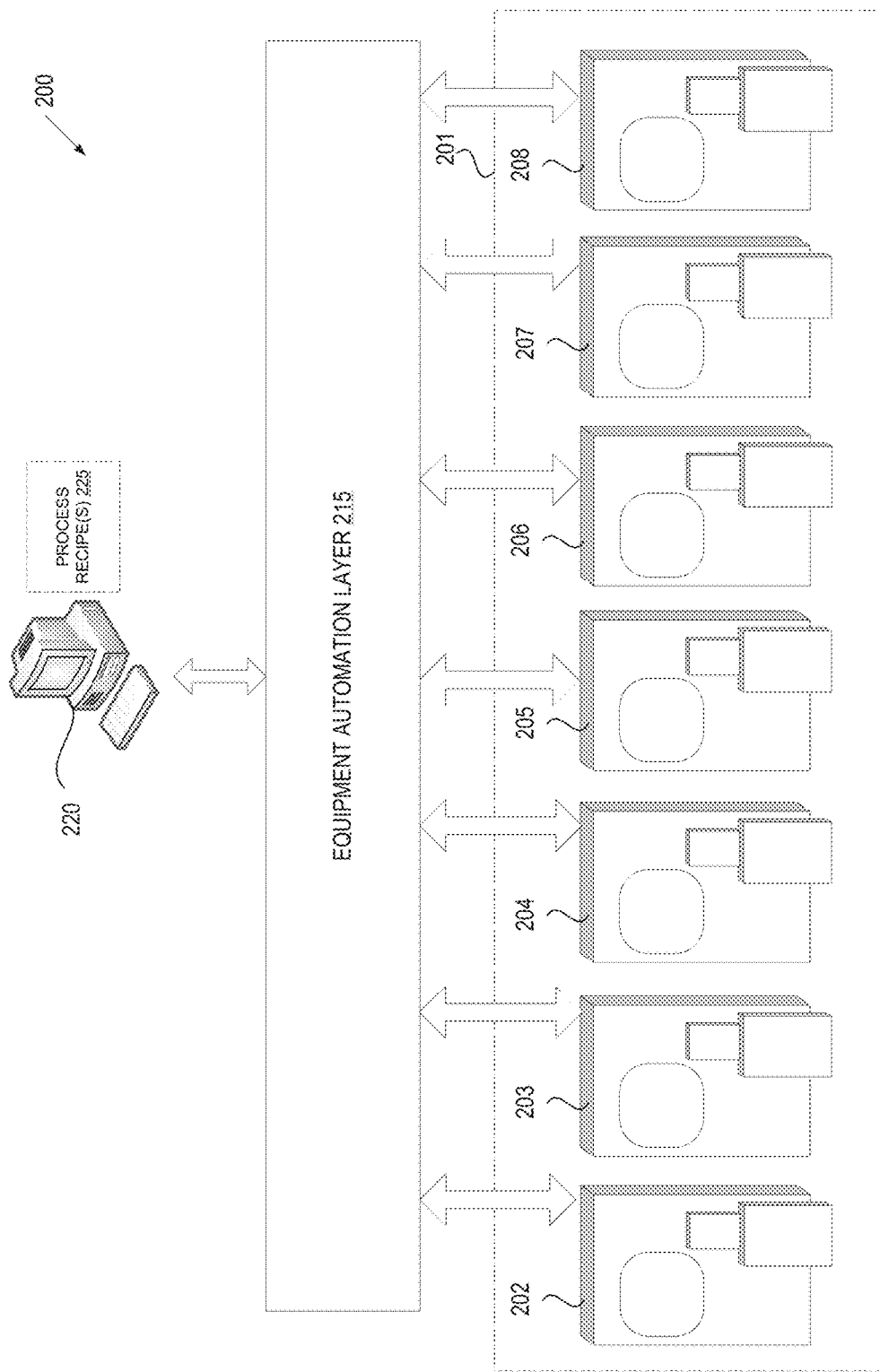
FIG. 2 illustrates an example architecture of a manufacturing system, in accordance with one embodiment of the present invention.

FIG. 2 illustrates an example architecture of a manufacturing system 200, in accordance with embodiments of the present invention. The manufacturing system 200 may be a ceramics manufacturing system. In one embodiment, the manufacturing system 200 includes processing equipment 201 connected to an equipment automation layer 215. The processing equipment 201 may include a furnace 202, a wet cleaner 203, a plasma spraying system 204, an atomic layer deposition (ALD) system 205, an IAD system 206, a plasma etch reactor 207, a bead blaster (nor shown), a CVD system (not shown), a plasma cleaner 208, and/or another processing chamber uses a fluorine-based plasma. The manufacturing system 200 may further include one or more computing device 220 connected to the equipment automation layer 215. In alternative embodiments, the manufacturing system 200 may include more or fewer components. For example, the manufacturing system 200 may include manually operated (e.g., off-line) processing equipment 201 without the equipment automation layer 215 or the computing device 220.

Furnace 202 is a machine designed to heat articles such as ceramic articles. Furnace 202 includes a thermally insulated chamber, or oven, capable of applying a controlled temperature on articles (e.g., ceramic articles) inserted therein. In one embodiment, the chamber is hermetically sealed. Furnace 202 may include a pump to pump air out of the chamber, and thus to create a vacuum within the chamber. Furnace 202 may additionally or alternatively include a gas inlet to pump gasses (e.g., inert gasses such as Ar or $N_2$ and/or reactive gases such as hydrogen fluoride (HF)) into the chamber. Furnace 202 may be used to perform an HF heat treatment process in embodiments.

Wet cleaner 203 is an apparatus that includes a bath and a heating element. Wet cleaner 203 may clean articles (e.g., chamber components) using a wet clean process. Wet cleaner 203 includes a wet bath filled with an HF acid solution or other fluorine-based acid solution (e.g., such as an acid solution containing fluoroantimonic acid, ammonium fluoride ($NH_4F$) and/or sulfurofluoridic acid). A chamber component having a metal oxide coating may be immersed in the HF acid solution (or other fluorine-based acid solution) at a temperature of about 0-100° C. (or about room temperature to about 100° C.) to convert at least a portion of the metal oxide to a M—O—F. In some embodiments, the HF acid solution (or other fluorine-based acid solution) may remove surface contaminants from the article and/or may remove a M(OH) layer oxide from a surface of a metal oxide coating. In one embodiment, an acid solution containing approximately 0.05-50 vol % HF and 50-95 vol % water is used. In one embodiment, an acid solution containing about 0.05-1.0 (or 0.05-0.1) vol % HF, 99.5-99.95 vol. % water and an amount of ammonium fluoride as a buffering agent is used.

Plasma spraying system 204 is a machine configured to plasma spray a ceramic coating to the surface of an article. Plasma spraying system 204 may be a low pressure plasma spraying (LPPS) system or an atmospheric pressure plasma spraying (APPS) system. Both LPPS systems and APPS systems may be used to deposit a porous, low density plasma resistant layer (e.g., a second plasma resistant layer for a multi-layer plasma resistant coating). An LPPS system includes a vacuum chamber that can be pumped down to reduced pressure (e.g., to a vacuum of 1 Mbar, 10 Mbar, 35 Mbar, etc.), while an APPS system does not include any vacuum chamber, and may instead include an open chamber or room.

In a plasma spraying system 204, an arc is formed between two electrodes through which a gas is flowing. As the gas is heated by the arc, the gas expands and is accelerated through a shaped nozzle of a plasma torch, creating a high velocity plasma jet. Powder composed of a ceramic and/or metal material is injected into the plasma jet by a powder delivery system. An intense temperature of the plasma jet melts the powder and propels the molten ceramic and/or metal material towards an article. Upon impacting with the article, the molten powder flattens, rapidly solidifies, and forms a layer of a ceramic coating that adheres to the article. The parameters that affect the thickness, density, and roughness of the plasma sprayed layer include type of powder, powder size distribution, powder feed rate, plasma gas composition, gas flow rate, energy input, pressure, and torch offset distance. Alternatively, suspension plasma spray (SPS) may be performed and the powder may be dispersed in a liquid suspension before being injected into the plasma jet. The plasma sprayed layer may have a porosity of about 2-5% in embodiments. Porosity is a measure of a void (e.g., empty space) in a material, and is a fraction of the volume of voids over the total volume of the material.

ALD system 205 is a system that performs atomic layer deposition to form a thin dense conformal layer on an article. ALD allows for a controlled self-limiting deposition of material through chemical reactions with the surface of the article. Aside from being a conformal process, ALD is also a uniform process. All exposed sides of the article, including high aspect ratio features (e.g., about 10:1 to about 300:1) will have the same or approximately the same amount of material deposited. A typical reaction cycle of an ALD process starts with a precursor (i.e., a single chemical A) flooded into an ALD chamber and adsorbed onto the surface of the article in a first half reaction. The excess precursor is then flushed out of the ALD chamber before a reactant (i.e., a single chemical R) is introduced into the ALD chamber for a second half reaction and subsequently flushed out. This process may be repeated to build up an ALD layer having a thickness of up to about 1 micron in some embodiments.

Unlike other techniques typically used to deposit coatings on articles, such as plasma spray coating and ion assisted deposition, the ALD technique can deposit a layer of material within high aspect ratio features (i.e., on the surfaces of the features). Additionally, the ALD technique produces relatively thin (i.e., 1 μm or less, or in some cases 10 μm or less) coatings that are porosity-free (i.e., pin-hole free). The term "porosity-free" as used herein means absence of any pores, pin-holes, or voids along the whole depth of the coating as measured by transmission electron microscopy (TEM).

The precursors used by the ALD system 205 to form a plasma resistant layer depend on the plasma resistant layer that is formed. In some embodiments, the plasma resistant layer is $Al_2O_3$, and is formed from an aluminum precursor such as diethylaluminum ethoxide, tris(ethylmethylamido) aluminum, aluminum sec-butoxide, aluminum tribromide, aluminum trichloride, triethylaluminum, triisobutylaluminum, trimethylaluminum, or tris(diethylamido)aluminum. In some embodiments, the plasma resistant layer is $Y_2O_3$ or $YF_3$, and is formed from a yttrium precursor such as tris(N,N-bis(trimethylsilyl)amide)yttrium (III), tris(2,2,6,6-tetramethyl-3,5-heptanedionato)yttrium(III) or yttrium (III) butoxide. In some embodiments, the plasma resistant layer is $Er_2O_3$, and is formed from an erbium precursor such as tris-methylcyclopentadienyl erbium(III) ($Er(MeCp)_3$), erbium boranamide ($Er(BA)_3$), $Er(TMHD)_3$, erbium(III)tris (2,2,6,6-tetramethyl-3,5-heptanedionate), and tris(butylcyclopentadienyl)erbium(III).

The reactants that are used by the ALD system 205 to form the plasma resistant layer may be oxygen, water vapor, ozone, pure oxygen, oxygen radicals, or another oxygen source if the deposited plasma resistant layer is an oxide. The reactants may be a fluoride (e.g., $TiF_4$) if a $YF_3$ plasma resistant layer is to be formed.

A CVD system performs chemical vapor deposition (CVD). CVD is a chemical process in which an article is exposed to one or more volatile precursors that react with and/or decompose onto the article to form a layer (e.g., to form a $YF_3$ layer or a $Y_2O_3$ layer).

The EB-IAD system 206 is a system that performs electron beam ion assisted deposition. Alternatively, other types of IAD systems may be used in embodiments, such as activated reactive evaporation ion assisted deposition (ARE-IAD) or ion beam sputtering ion assisted deposition (IBS-IAD). EB-IAD may be performed by evaporation. IBS-IAD may be performed by sputtering a solid target material (e.g., a solid metal target). Any of the IAD methods may be performed in the presence of a reactive gas species, such as $O_2$, $N_2$, halogens, etc.

For the various types of IAD, a thin film plasma resistant layer is formed by an accumulation of deposition materials in the presence of energetic particles such as ions. The deposition materials include atoms, ions, radicals, or their mixture. The energetic particles may impinge and compact the thin film plasma resistant layer as it is formed.

For IAD, a material source provides a flux of deposition materials while an energetic particle source provides a flux of the energetic particles, both of which impinge upon an article throughout the IAD process. The energetic particle source may be an Oxygen or other ion source. The energetic particle source may also provide other types of energetic particles such as radicals, atoms, ions, and nano-sized particles which come from particle generation sources (e.g., from plasma, reactive gases or from the material source that provide the deposition materials). The material source (e.g., a target body) used to provide the deposition materials may be a bulk sintered ceramic corresponding to the same ceramic that the plasma resistant layer is to be composed of.

IAD may utilize one or more plasmas or beams to provide the material and energetic ion sources. Reactive species may also be provided during deposition of the plasma resistant coating. With IAD processes, the energetic particles may be controlled by the energetic ion (or other particle) source independently of other deposition parameters. The energy (e.g., velocity), density and incident angle of the energetic ion flux may be selected to achieve a target composition, structure, crystalline orientation and grain size of the plasma resistant layer. Additional parameters that may be adjusted are a temperature of the article during deposition as well as the duration of the deposition. EB-IAD and IBS-IAD depositions are feasible on a wide range of surface conditions. However, IAD performed on polished surfaces may achieve increased breakdown voltages.

Plasma etch reactor 207 is a processing chamber that uses plasmas to perform etch processes. Plasma cleaner 208 is a processing chamber that uses plasmas to perform clean processes. Plasma etch reactor 207 and/or plasma etch cleaner 208 may correspond to processing chamber 100 of FIG. 1 in embodiments.

The equipment automation layer 215 may interconnect some or all of the manufacturing machines 201 with computing devices 220, with other manufacturing machines, with metrology tools and/or other devices. The equipment automation layer 215 may include a network (e.g., a location area network (LAN)), routers, gateways, servers, data stores, and so on. Manufacturing machines 201 may connect to the equipment automation layer 215 via a SEMI Equipment Communications Standard/Generic Equipment Model (SECS/GEM) interface, via an Ethernet interface, and/or via other interfaces. In one embodiment, the equipment automation layer 215 enables process data (e.g., data collected by manufacturing machines 201 during a process run) to be stored in a data store (not shown). In an alternative embodiment, the computing device 220 connects directly to one or more of the manufacturing machines 201.

In one embodiment, some or all manufacturing machines 201 include a programmable controller that can load, store and execute process recipes. The programmable controller may control temperature settings, gas and/or vacuum settings, time settings, etc. of manufacturing machines 201. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

In one embodiment, the manufacturing machines 201 are programmed to execute recipes that will cause the manufacturing machines to heat treat an article, coat an article, and so on. In one embodiment, the manufacturing machines 201 are programmed to execute process recipes 225 that perform operations of a multi-step process for manufacturing an article or coating, as described with reference to FIGS. 3A, 4A and 6A. In one embodiment, one or more of the manufacturing machines 201 are programmed to execute a process recipe for an in-situ fluorination process to protect chamber components prior to performing a process recipe that uses a fluorine-based plasma to process a substrate, as described with reference to FIG. 5. The computing device 220 may store one or more process recipes 225 that can be downloaded to the manufacturing machines 201 to cause the manufacturing machines 201 to manufacture articles in accordance with embodiments of the present invention.

Figures 3A, 3B:
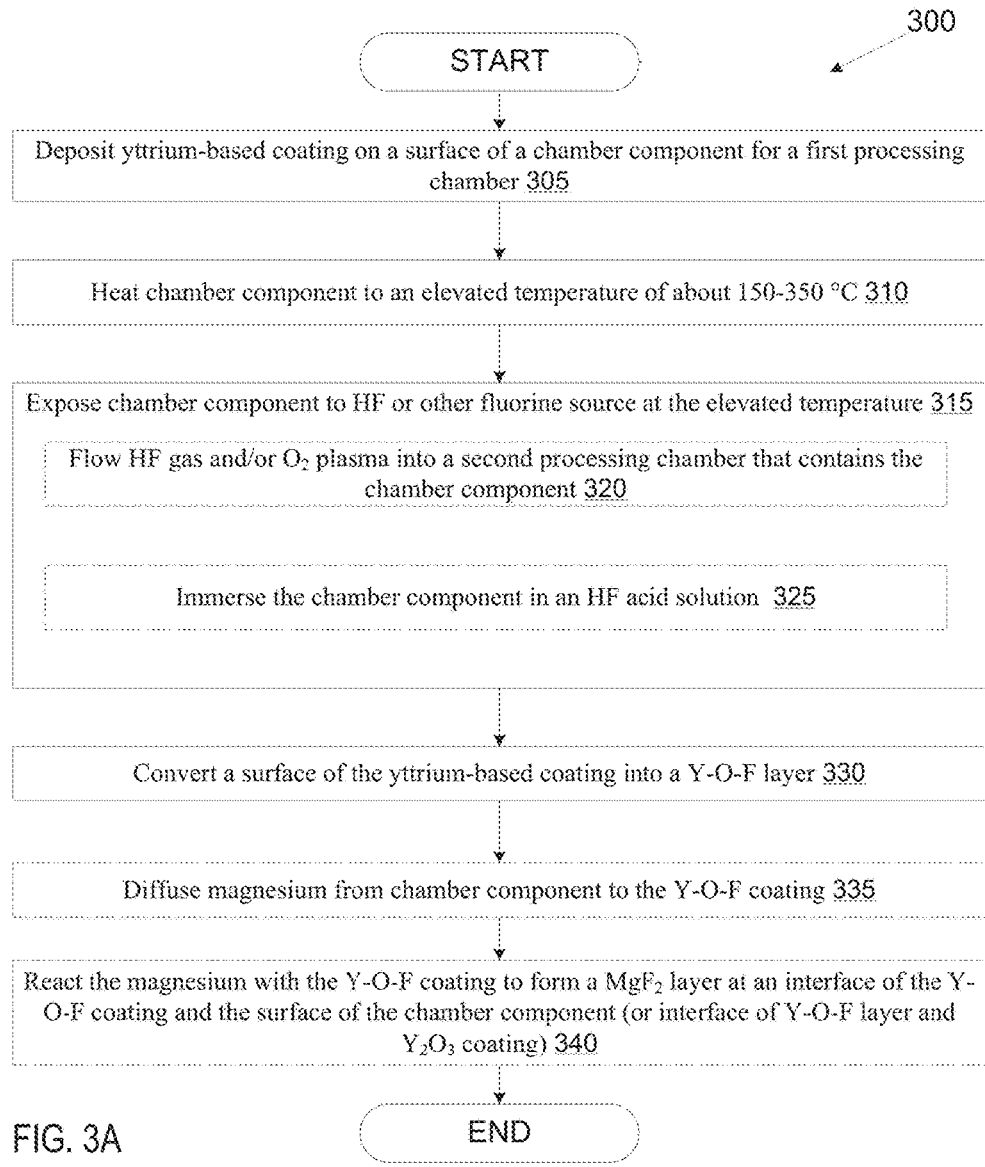
FIG. 3A illustrates a process for forming a M-O—F layer at a surface of a metal oxide coating according to an embodiment.
FIG. 3B illustrates a cross sectional side view of a chamber component that includes a $Y_2O_3$ coating and a Y—O—F layer according to an embodiment.

FIG. 3A illustrates a process 300 for converting at least a surface of a $Y_2O_3$ coating or other yttrium-based oxide coating into a Y—O—F layer or other metal oxy-fluoride layer or coating according to an embodiment. Alternatively, process 300 may be performed to form a Y—O—F layer or other metal oxy-fluoride layer at a surface of a sintered ceramic article of $Y_2O_3$ or another metal oxide. Note that process 300 may be modified to apply to the formation of a M-O—F layer from other metal oxide coatings as well. Some examples of other metal oxides that may be used in embodiments include $Al_2O_3$, $Er_2O_3$, $Y_2O_3$ stabilized $ZrO_2$ (YSZ), $Er_3Al_5O_{12}$ (EAG), a solid solution of $Y_2O_3$—$ZrO_2$, and a composite ceramic comprising $Y_4Al_2O_9$ and a solid solution of $Y_2O_3$—$ZrO_2$. In one embodiment, the yttrium-based oxide coating includes a stack of alternating layers of $Y_2O_3$ and another oxide such as $ZrO_2$ and/or $Al_2O_3$. The $Y_2O_3$ layers may be substantially thicker than the $Al_2O_3$ layers (e.g., anywhere from 5-10 times thicker than the $Al_2O_3$ layers) in some embodiments. For example, if the $Y_2O_3$ layers and other oxide layers are formed using ALD, then the $Y_2O_3$ layers may be formed by applying a 8-10 ALD deposition cycles and the additional oxide layers may be formed by applying 1-2 ALD deposition cycles, where each ALD deposition cycle produces approximately 1 monolayer.

In one embodiment, the metal oxide coating is a coating that includes or consists of a solid solution of yttria and zirconia ($Y_2O_3$—$ZrO_2$). The solid solution of $Y_2O_3$—$ZrO_2$ may include 20-80 mol % $Y_2O_3$ and 20-80 mol % $ZrO_2$ in one embodiment. In a further embodiment, the solid solution of $Y_2O_3$—$ZrO_2$ includes 30-70 mol % $Y_2O_3$ and 30-70 mol % $ZrO_2$. In a further embodiment, the solid solution of $Y_2O_3$—$ZrO_2$ includes 40-60 mol % $Y_2O_3$ and 40-60 mol % $ZrO_2$. In a further embodiment, the solid solution of $Y_2O_3$—$ZrO_2$ includes 50-80 mol % $Y_2O_3$ and 20-50 mol % $ZrO_2$. In a further embodiment, the solid solution of $Y_2O_3$—$ZrO_2$ includes 60-70 mol % $Y_2O_3$ and 30-40 mol % $ZrO_2$. In other examples, the solid solution of $Y_2O_3$—$ZrO_2$ may include 45-85 mol % $Y_2O_3$ and 15-60 mol % $ZrO_2$, 55-75 mol % $Y_2O_3$ and 25-45 mol % $ZrO_2$, 58-62 mol % $Y_2O_3$ and 38-42 mol % $ZrO_2$, and 68-72 mol % $Y_2O_3$ and 28-32 mol % $ZrO_2$.

Any of the aforementioned metal oxide coatings may contain one or more dopants that combined comprise up to about 2 mol % of the coating. Such dopants may be rare earth oxides from the lanthanide series, such as Er (erbium), Ce (cerium), Gd (gadolinium), Yb (ytterbium), Lu (lutetium), and so on. Such dopants may additionally or alternatively include Al (aluminum) and/or Si (silicon).

The M-O—F layer that is formed will depend on the specific metal oxide coating that is used. Process 300 is described with reference to yttrium-based oxide coatings (e.g., $Y_2O_3$) and Y—O—F. However, it should be understood that process 300 may equally apply to formation of other M-O—F layers on other metal oxide coatings.

At block 305 of process 300, a $Y_2O_3$ coating or other yttrium-based oxide coating is deposited on a surface of a chamber component for a first processing chamber. The yttrium-based oxide coating may be deposited using any of the deposition techniques described herein, such as plasma spraying, ALD, IAD, and so on. If APPS is performed, then the yttrium-based oxide coating may have a thickness of about 100-300 microns and have a porosity of about 2-5%. If SPS is performed, then the yttrium-based oxide coating may have a thickness of about 50-100 microns and have a porosity of about 1-3%. If IAD is performed, then the yttrium-based oxide coating may have a thickness of about 1-20 microns and have a porosity of less than about 0.1% (e.g., effectively 0%). If ALD is performed, then the yttrium-based oxide coating may have a thickness of about 10 nm to about 10 microns (e.g., about 1 micron) and have a porosity of about 0%. If ALD or IAD are performed, then the yttrium-based oxide coating is a conformal coating. As used herein the term conformal as applied to a layer means a layer that covers features of an article with a substantially uniform thickness. In one embodiment, conformal layers discussed herein have a conformal coverage of the underlying surface that is coated (including coated surface features) with a uniform thickness having a thickness variation of less than about +/−20%, a thickness variation of +/−10%, a thickness variation of +/−5%, or a lower thickness variation.

Alternatively, in some embodiments no yttrium-based oxide coating or other metal oxide coating is deposited. Instead the chamber component body may be composed of a metal oxide such as $Al_2O_3$ or $Y_2O_3$.

At block 310, the chamber component may be placed in a second processing chamber and may be heated to an elevated temperature of about 50-500° C. In one embodiment, the chamber component is heated to about 150-350° C. The second processing chamber may be a furnace or may be a wet cleaner that includes an HF acid bath (or acid bath containing another fluorine-based acid solution such as $NH_4$ For a mixture of HF and $NH_4F$, for example. At block 315, the chamber component is exposed to HF at the elevated temperature. Alternatively, the chamber component may be exposed to another fluorine source, such as $NF_3$ gas, $NF_3$ plasma, $CF_4$ plasma (e.g., a $CF_4$/Ar plasma), $F_2$, and/or F radicals. If an HF acid solution (or other fluorine-based acid solution) is used, then the HF acid solution (or other fluorine-based acid solution) may be maintained at a temperature of about 0-100° C. (or about room temperature to about 100° C.). In such embodiments, the second processing chamber may or may not be heated. The combination of exposure to the elevated temperature and the HF may be referred to as an HF heat treatment process.

In one embodiment, at block 320 a flow of HF gas (e.g., anhydrous hydrogen fluoride gas) is introduced into the second processing chamber that contains the chamber component. A flow rate of the HF gas may be about 100-1000 SCCM. In one embodiment, an $O_2$ plasma is also flowed into the second processing chamber. A power of about 100-1000 Watts may be used for the $O_2$ plasma. The $O_2$ plasma may be generated by a remote plasma source in embodiments. The elevated temperature in one embodiment is 150-200° C.

In one embodiment, at block 325 the chamber component is immersed in an HF acid bath solution (or other fluorine-based acid solution). The HF acid bath solution may contain about 50-99.5 vol % water and 0.5-50 vol % HF acid. In one embodiment, the HF acid bath solution contains about 0.5-1.0 vol % HF acid and about 99-99.95 vol % water. In one embodiment the HF acid bath solution is any of the aforementioned HF acid bath solutions and additionally contains an ammonium fluoride ($NH_4F$) buffering agent. In one embodiment, the HF acid bath solution contains 0.5 mol % of the $NH_4F$ buffering agent. The temperature in one embodiment is 0-100° C. Alternatively, the temperature may be 250-350° C.

In one embodiment, at block 328 NF3 plasma or CF4 plasma (e.g., CF4/Ar plasma) is flowed into the second chamber. The plasma may be inductively coupled plasma (ICP) or capacitively coupled plasma (CCP). A power of the plasma may be, for example, 150-500 Watts.

The treatment in the presence of the HF gas or the HF acid solution (or other fluorine source) causes a chemical reaction at the surface of the metal oxide coating (or metal oxide ceramic article) that replaces a portion of the bonds to oxygen with bonds to fluorine. In the case of an HF acid solution, the solution may not be heated as discussed above.

As a result of the HF treatment, a $Y_2O_3$ becomes Y—O—F starting at the surface of the $Y_2O_3$ coating. Some example reactions are shown below:

$$6HF + Al_2O_3 \rightarrow 2AlF_3 + 3H_2O$$

$$6HF + Y_2O_3 \rightarrow 2YF_3 + 3H_2O$$

$$4HF + ZrO_2 \rightarrow ZrF_4 + 2H_2O$$

The water that results from the reaction may evaporate at the treatment temperature and/or may become part of the HF acid solution, leaving behind the fluoride. Accordingly, a chemical reaction is performed that replaces a portion of the oxygen molecules in the yttrium oxide (or other metal oxide) coating with fluorine molecules at a surface of the article or coating. The reaction depth is a function of time and temperature. The reaction may penetrate into the surface of the article or coating to a depth of from about 10 nm to a depth of up to about 5 μm (e.g., to about 200 nm) in some embodiments. In some embodiments, an entirety of the yttrium-based oxide coating (or other metal oxide coating) is converted into a Y—O—F coating (or other M—O—F coating).

The fluorine concentration in the M—O—F layer and depth or thickness of the metal oxide that is converted into the M—O—F layer depends on the composition of the metal oxide being fluorinated, the fluorine concentration in the fluorine-based plasma (or HF acid solution), the temperature, and the duration of the fluorination treatment. Experimentation has shown that relatively low temperature fluorination treatment (e.g., at below about 100° C.) for 1-5 hours results in a fluorination of about the top 50-70 nm of a $Y_2O_3$ coating or $Y_2O_3$ bulk sintered article. High temperature fluorination (e.g., at above about 400° C.) results in fluorination of an entire $Y_2O_3$ coating for coatings having a thickness of about 50 nm to about 5 μm (e.g., about 200 nm). Examples of fluorination treatment conditions and resultant metal oxy-fluoride layers are provided in FIGS. 7B-12B below.

Exposure of metal oxides to air generally causes a layer of —OH groups to form on the surface of the metal oxides (e.g., forming a M(OH) layer). The M(OH) layer has multiple undesirable effects, as described above. Exposure of the M(OH) layer (e.g., a $Y(OH)_3$ layer) to the HF at the temperature may cause the M(OH) layer to convert into a M—O—F layer in a similar manner to the metal oxide coating or article. Accordingly, M(OH) layers can be removed by the HF heat treatment. Furthermore, the M—O—F layer or coating is not susceptible to further formation of —OH groups on its surface.

If the yttrium-based oxide coating is an alternating stack of $Y_2O_3$ layers and additional oxide layers as described above, then the $Y_2O_3$ layers may transform into Y—O—F layers and the additional oxide layers may transform into additional M—O—F layers in embodiments.

In some embodiments the chamber component contains magnesium (e.g., is an aluminum alloy that contains magnesium). In one embodiment, at block 335 magnesium from the chamber component is diffused towards the surface of the chamber component and to the Y—O—F coating or other M—O—F coating. The diffusion may occur as a result of the HF treatment. At block 340, the magnesium reacts with the M—O—F coating to form an $MgF_2$ layer at an interface of the M—O—F coating. The interface of the M—O—F coating may be an interface between the M—O—F coating and the chamber component if all of the yttrium-based oxide coating was converted into M—O—F. Alternatively, the interface of the M—O—F coating may be an interface between the M—O—F layer and the yttrium-based oxide coating if not all of the yttrium-based oxide coating is converted to M—O—F. The $MgF_2$ layer acts as a barrier layer for magnesium, and prevents the magnesium from diffusing past the $MgF_2$ layer. Similarly, other metals may diffuse towards the M—O—F layer and react with the M—O—F layer to form other metal fluoride barrier layers.

In some embodiments, chemical treatments may be performed to the yttrium-based oxide coating before the HF treatment and/or after the HF treatment. These chemical treatments may improve a quality (e.g., stability) of the M—O—F layer.

FIG. 3B illustrates a cross sectional side view of a chamber component 350 that includes a $Y_2O_3$ coating 360 on a body 355 of the chamber component 350 and a Y—O—F layer 365 over the $Y_2O_3$ coating 360 according to an embodiment. The chamber component 350 may have a metal body (e.g., aluminum or an aluminum alloy such as Al 6061) or a ceramic body (e.g., $Al_2O_3$, AlN, SiC, etc.).

Figure 4A:
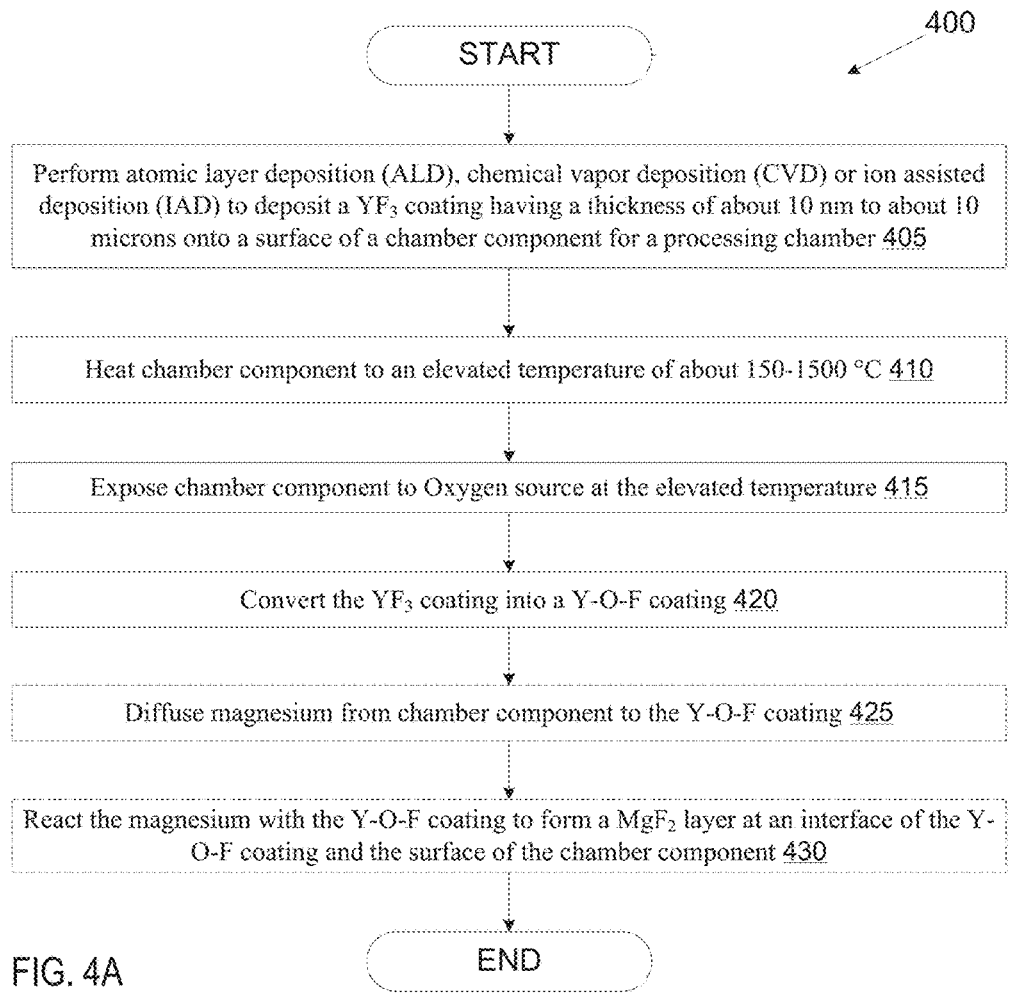
FIG. 4A illustrates a process for converting a $YF_3$ coating into a Y—O—F coating according to an embodiment.

FIG. 4A illustrates a process 400 for converting a $YF_3$ coating or other rare earth fluoride coating into a Y—O—F coating or other M—O—F coating according to an embodiment. Process 400 may also be performed to convert other yttrium-based fluoride coatings into Y—O—F coatings or other yttrium based oxy-fluorides. Examples of other yttrium-based fluoride coatings include $Y_xF_yZr_z$ (where x, y and z are positive integer or fractional values), $ErF_3$, $Y_xEr_yF_z$ (where x, y and z are positive integer or fractional values), and so on. For example, a yttrium-based fluoride may include a mixture of 20-80 mol % $YF_3$ and 20-80 mol % $ZrF_4$. Other examples may include 45-85 mol % $YF_3$ and 15-60 mol % $ZrF_4$, 55-75 mol % $YF_3$ and 25-45 mol % $ZrF_4$, 58-62 mol % $YF_3$ and 38-42 mol % $ZrF_4$, and 68-72 mol % $YF_3$ and 28-32 mol % $ZrF_4$. In another example, a yttrium-based fluoride may include 50-90 mol % $YF_3$ and 10-50 mol % $ErF_3$, 10-90 mol % $YF_3$ and 10-90 mol % $ErF_3$, 30-70 mol % $YF_3$ and 30-70 mol % $ErF_3$, 60-80 mol % $YF_3$ and 20-40 mol % $ErF_3$, and so on. Process 400 is discussed with reference to conversion of $YF_3$ to Y—O—F. However, it should be understood that process 400 may also be performed to convert other yttrium-based fluorides into yttrium-based oxy-fluorides. Accordingly, $YF_3$ in the below discussion may be replaced with any other yttrium-based fluoride and Y—O—F in the below discussion may be replaced with any other yttrium-based oxy-fluoride.

In an example, the yttrium-based fluorides may be a $YF_3$—$ZrF_4$ solid solution, an alternating stack of $YF_3$ layers and $AlF_3$ layers or other metal fluoride layers, or a composite ceramic comprising a first phase of Y-AL-F and a second phase of Y—Zr—F. The $YF_3$—$ZrF_4$ solid solution may comprise about 50-75 mol % $YF_3$ and about 25-50 mol % $ZrF_4$, and may be converted into Y—Zr—O—F with a ratio of Y to Zr of about 1:1 to 3:1. In embodiments, the $YF_3$—$ZrF_4$ solid solution may comprise 55-65 mol % $YF_3$ and about 35-45 mol % $ZrF_4$. In embodiments, the $YF_3$—$ZrF_4$ solid solution may comprise 65-75 mol % $YF_3$ and about 25-55 mol % $ZrF_4$. For the alternating stack of $YF_3$ layers and $AlF_3$ layers (or other metal fluoride layers), the $YF_3$ layers may have a thickness that is about 5-10 times a thickness of the $AlF_3$ layers or other metal fluoride layers. For example, the YF3 layers may have a thickness of about 5-100 angstroms and the AlF3 layers may have a thickness of about 1-20 angstroms. The $YF_3$ layers may be converted into Y—O—F layers approximately having a thickness of the original $YF_3$ layers and the $AlF_3$ layers may be converted into Al—O—F layers having approximately a thickness of the original AlF₃ layers. For the composite ceramic, the first phase of Y—Al—F may be converted to Y—Al—O—F and the second phase may be converted to Y—Zr—O—F.

At block 405 of process 400 ALD, CVD or IAD is performed to deposit a YF₃ or other rare earth fluoride coating onto a chamber component for a processing chamber. If ALD is performed, then the YF₃ coating (or other yttrium-based fluoride coating) has a thickness of about 10 nm to 10 microns. If EB-IAD is performed, then the YF₃ coating (or other yttrium-based fluoride coating) has a thickness of about 0.5-10 microns. If CVD is performed, then the YF₃ coating (or other yttrium-based fluoride coating) has a thickness of about 100 nm to about-10 microns. In one embodiment, the IAD deposited YF₃ coating (or other yttrium-based fluoride coating) has a thickness of 5 microns. Both the ALD coating and the IAD coating are conformal coatings having a very low porosity of about 0% (e.g., having no porosity). The YF₃ coating (or other yttrium-based fluoride coating) may be an amorphous coating in embodiments, as has been determined through x-ray powder diffraction (XRD) phase investigation.

At block 410, the chamber component may be placed in a processing chamber (e.g., a processing chamber of a furnace) and may be heated to an elevated temperature of about 100-1500° C. Some example temperatures to which the chamber component may be heated include 200° C., 250° C., 300° C., 400° C., 500°, 600° C., 650° C., 750° C. and 800° C. At block 415, the chamber component is exposed to an oxygen source at the elevated temperature for a time period. The oxygen source may be air, O₂ gas, water vapor, O₃ gas, an O₂ plasma, and/or other oxygen-based plasma or oxygen-based radicals. Other oxygen sources include ion bombardment of the YF₃ coating (or other yttrium-based fluoride coating) using O₂ ions and/or radicals. The combination of exposure to the elevated temperature and the oxygen source may be referred to as an oxygen heat treatment process. The time period may be 12-24 hours in embodiments. In other embodiments, the time period may be 0.1-72 hours. In some embodiments the processing chamber is or contains metal, and the elevated temperature is 150-650° C. In some embodiments, the elevated temperature is 300-400° C. In some embodiments the processing chamber is ceramic and has a coefficient of thermal expansion (CTE) that closely matches a CTE of the YF₃ coating (or other yttrium-based fluoride coating). In such embodiments the elevated temperature may be as high as 1500° C.

In one embodiment, at block 420 the YF₃ coating (or other yttrium-based fluoride coating) is converted into a Y—O—F coating (or other M-O—F coating). In one embodiment, a portion of the YF₃ coating (or other yttrium-based fluoride coating) is converted to a Y—O—F layer or other M-O—F layer (e.g., a surface of the YF₃ coating is converted). In one embodiment, an entirety of the YF₃ coating (or other yttrium-based fluoride coating) is converted to a Y—O—F coating or other M-O—F coating. The Y—O—F coating may be a crystalline coating without any cracking, as has been shown in XRD phase investigation. Film thicknesses of 10 microns and above have been shown to experience vertical cracking when converted from YF₃ to Y—O—F. Accordingly, YF₃ films of less than 10 microns is used in embodiments.

The heat treatment in the presence of an oxygen source causes a chemical reaction at the surface of the coating that replaces a portion of the bonds to fluorine with bonds to oxygen. Accordingly, a chemical reaction is performed that replaces a portion of the fluorine molecules in the YF₃ coating with oxygen molecules at a surface of the article or coating. The reaction depth is a function of time and temperature.

In some embodiments the chamber component contains magnesium (e.g., is an aluminum alloy that contains magnesium). In one embodiment, at block 335 magnesium from the chamber component is diffused towards the surface of the chamber component and to the Y—O—F coating. The diffusion may occur as a result of the HF treatment. At block 340, the magnesium reacts with the Y—O—F coating to form an MgF₂ layer at an interface of the Y—O—F coating. The interface of the Y—O—F coating may be an interface between the Y—O—F coating and the chamber component if all of the YF₃ coating was converted into Y—O—F.

In one example, a 1 micron thick amorphous YF₃ coating was exposed to air at 350° C. for 12 hours. A result was that a majority of the YF₃ coating was converted to a crystalline Y—O—F coating with no cracking. In particular, the coating contained 83.7 wt. % Y—O—F and 13.7 wt. % YF₃ after the oxygen heat treatment. In the example test, the chamber component was Al 6061 and contained magnesium. The magnesium diffused to the Y—O—F coating and formed MgF₂. Accordingly, the XRD phase investigation shows a minor phase of 2.6 wt. % MgF₂ at the interface between the coating and the substrate. The emissivity of as-deposited YF₃ is 0.351 and the emissivity of the Y—O—F layer is 0.149.

Y—O—F has a lower molar volume than YF₃. Accordingly, a compressive stress of the YF3 coating may be reduced when the YF3 coating is converted into the Y—O—F coating. Accordingly, the conversion can be performed to adjust the "zero stress state" of the coating. The term "zero stress state" means the state at which the coating is not under any tensile or compressive stress (e.g., does not have any internal compressive or tensile stress). The zero stress state generally occurs at the deposition temperature.

Figure 4B:
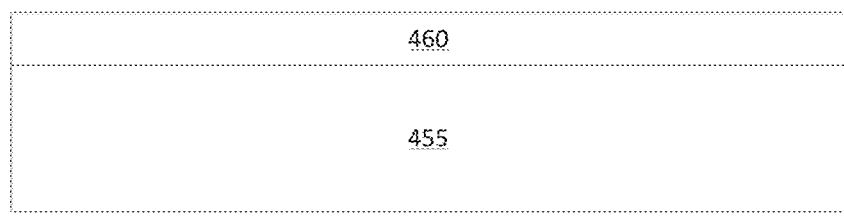
FIG. 4B illustrates a cross sectional side view of a chamber component that includes a Y—O—F coating according to an embodiment.

FIG. 4B illustrates a cross sectional side view of a chamber component 450 that includes a Y—O—F coating 460 on a body 455 of the chamber component 450 according to an embodiment. The chamber component 450 may have a metal body (e.g., aluminum or an aluminum alloy such as Al 6061) or a ceramic body (e.g., Al₂O₃, AlN, SiC, etc.). The Y—O—F coating 460 may originally have been a YF₃ coating, and may have been completely converted to the Y—O—F coating 460. Similar results may be achieved by the conversion of other yttrium-based fluorides into yttrium-based oxy-fluorides.

Figure 5:
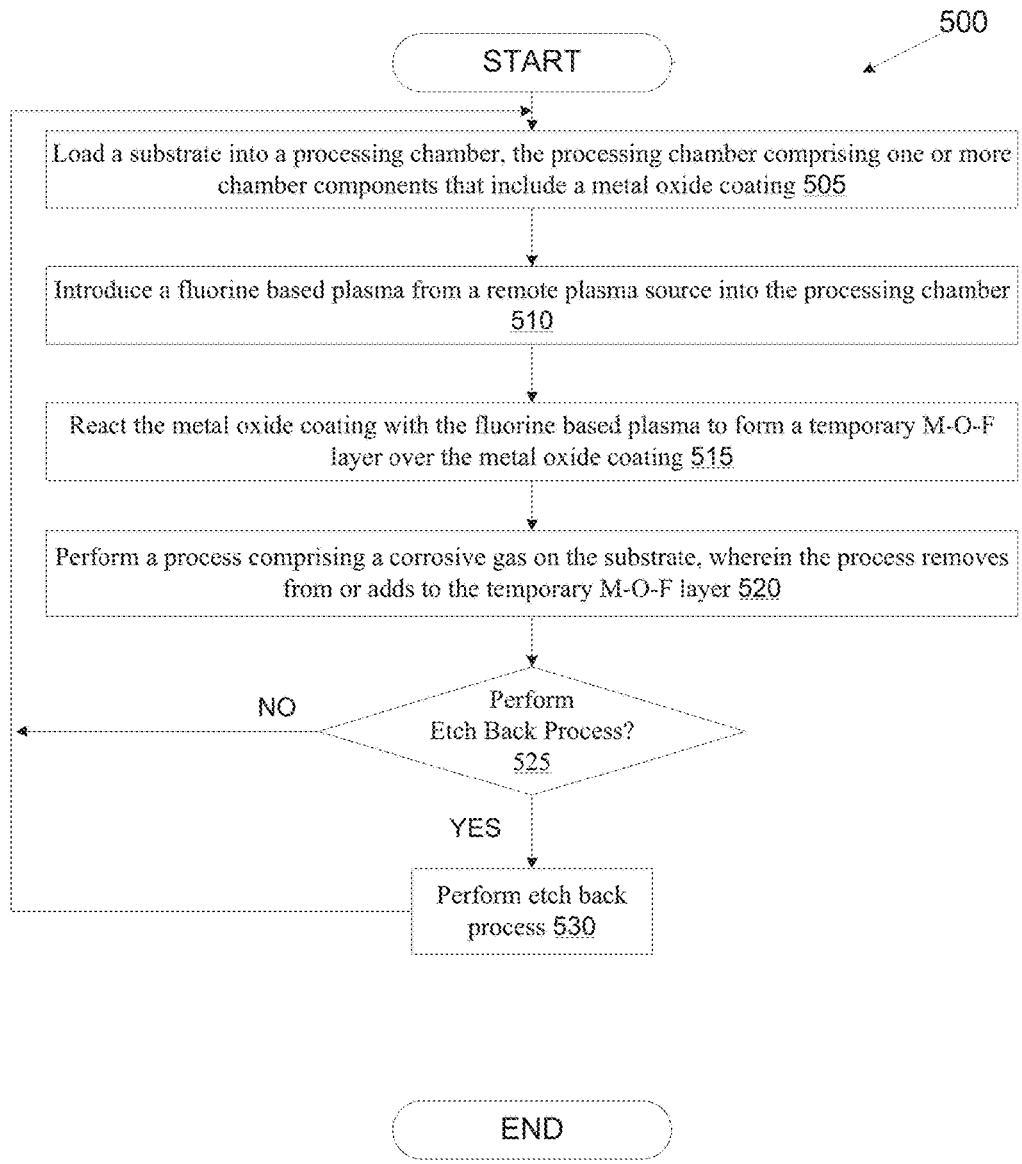
FIG. 5 illustrates an in-situ process for forming a temporary M-O—F layer or metal fluoride layer on a metal oxide coating or metal oxide article prior to a manufacturing process according to an embodiment.

FIG. 5 illustrates an in-situ process 500 for forming a temporary Y—O—F layer, yttrium based oxy-fluoride layer or other M-O—F layer on a metal oxide coating prior to a manufacturing process, referred to herein as an in-situ fluorination process, according to an embodiment. Alternatively, process 500 may be performed to form a M-O—F (e.g., Y—O—F or yttrium based oxy-fluoride) layer on a sintered metal oxide chamber component that lacks a metal oxide coating. Moreover, process 500 may also be performed to form a temporary YF₃ layer or other metal fluoride layer at the surface of the metal oxide coating or article rather than forming a M-O—F layer.

At block 505 of process 500, a substrate is loaded into a processing chamber. The processing chamber includes one or more chamber components that have a metal oxide coating. The metal oxide coating (or sintered metal oxide article) may be Al₂O₃, Er₂O₃, Y₂O₃, Y₂O₃ stabilized ZrO₂ (YSZ), Er₃Al₅O₁₂ (EAG), a solid solution of Y₂O₃—ZrO₂, or a composite ceramic comprising Y₄Al₂O₉ and a solid solution of Y₂O₃—ZrO₂, to name a few examples. The metal oxide coating may be an ALD coating having a thickness of 10 nm to 1 micron, a IAD coating having a thickness of 1-10 microns, a plasma sprayed coating having a thickness of 100-300 microns, an SPS coating having a thickness of 50-100 microns, a chemical vapor deposition (CVD) coating, or another type of coating (e.g., a coating of $Al_2O_3$ formed by anodization). Alternatively, the chamber component may be a bulk sintered ceramic article of a metal oxide that lacks a metal oxide coating.

At block 510, a fluorine-based plasma from a remote plasma source is introduced into the processing chamber in which the one or more chamber components are installed. Alternatively, a different fluorination source may be used, such as an HF gas. In one embodiment, a fluorine-based acid solution (e.g., an HF acid solution) is used as a fluorination source.

At block 515, the metal oxide coating (or metal oxide article) is reacted with the fluorine-based plasma or other fluorine source to form a temporary M-O—F layer or metal fluoride layer over the metal oxide coating (or metal oxide article). The temporary M-O—F layer or metal fluoride layer may be a very thin layer that is not meant to last more than a single process or a few processes. The temporary M-O—F layer may have a thickness of 1-50 nm (e.g., 1-5 nm) in embodiments.

The fluorine based plasma may be introduced to the processing chamber while the chamber at a temperature of about room temperature to about 1000° C. in embodiments. The chamber may have to a temperature of about room temperature to about 400° C. in further embodiments. The fluorine-based plasma may be introduced to the processing chamber for a duration of about 0.5-10 minutes in embodiments. The fluorine based plasma may be any of the aforementioned fluorine based plasmas. In one embodiment, an oxygen plasma and an HF gas are used rather than a fluorine based plasma.

In an alternative embodiment, the fluorine-based acid solution may be introduced to the processing chamber at room temperature up to about 100° C. The acid solution itself may be heated and/or the chamber may be heated in embodiments. In one embodiment, the fluorine-based acid solution is an HF acid solution comprising 50-95 vol % water and 5-50 vol % HF acid. The fluorine-based acid solution may be flowed into the chamber to fully or partially fill the chamber. Alternatively, the fluorine-based acid solution may be sprayed onto the one or more chamber components to be fluorinated. The exposure time of the one or more chamber components to the fluorine-based acid solution may be about 0.5-10 minutes (e.g., 0.8 minutes, 1.0 minutes, 1.2 minutes, 1.5 minutes, etc.). In some instances, the exposure time may be lower (e.g., around 0.2-0.4 minutes. Once the exposure time is complete, the chamber components may be rinsed (e.g., with DI water).

In some embodiments, the operations of block 505 are performed after the operations of block 515 and before the operations of block 520.

At block 520, the manufacturing process is performed. The manufacturing process may be, for example, a plasma etch process or a plasma clean process and may etch or clean a substrate secured within the processing chamber (e.g., a wafer having semiconductor circuits formed thereon). The manufacturing process may include the use of a corrosive gas (e.g., a fluorine-based plasma that will enable the plasma etch process or the plasma cleaning process, a chlorine based chemistry, an ammonia based chemistry, and so on). The corrosive gas may not erode, corrode or otherwise damage the metal oxide coating due to the presence of the M-O—F layer or the metal fluoride layer over the metal oxide coating (or metal oxide article). The corrosive gas may remove an entirety of the M-O—F layer or metal fluoride layer by the end of the manufacturing process in some embodiments, such as embodiments in which a chlorine based chemistry or ammonia based chemistry is used. Alternatively, the corrosive gas may remove just a portion of the M-O—F layer or metal fluoride layer (e.g., if a chlorine based chemistry or ammonia based chemistry is used). In some embodiments, the manufacturing process includes a fluorine based plasma under conditions that cause the M-O—F layer or metal fluoride layer to grow. In each of these examples, the M-O—F layer or metal fluoride layer may protect the underlying metal oxide coating and/or metal oxide article throughout the manufacturing process.

The in-situ fluorination process may be performed prior to each manufacturing process that will expose the processing chamber to corrosive gases. The M-O—F layer or metal fluoride layer may have a much lower erosion rate than the metal oxide coating when exposed to reducing chemistries such as chlorine chemistries, fluorine chemistries and ammonia chemistries. As a result, the useful life of the chamber components for the processing chamber may be greatly extended, process drift may be mitigated, and on wafer particles from chemical reaction of the corrosive gases with the metal oxide coating may be mitigated. Additionally, the M-O—F layer or metal fluoride layer may act as a diffusion barrier to block metal diffusion during the manufacturing process and may reduce metal contamination on processed substrates.

In some instances where the manufacturing process is a fluorine based process (e.g., that uses a fluorine gas or fluorine plasma), the manufacturing process itself may cause some portion of a metal oxide coating to convert to a metal fluoride or metal oxy-fluoride. However, other manufacturing processes (e.g., those that use chlorine or ammonia) will not cause such a metal fluoride or metal oxy-fluoride conversion. Moreover, in many cases there is a large surface area of chamber components that have the metal oxide coating. It can take many iterations of the manufacturing process before a sufficient metal oxy-fluoride or metal fluoride layer is built up on the metal oxide coating to protect the metal oxide coating. During this time process drift may occur due to the changing chamber conditions. The in-situ fluorination process can act as an in-situ seasoning process that quickly forms the metal oxy-fluoride layer or metal fluoride layer and that immediately protects the metal oxide coating and mitigates process drift. Additionally, with use of the in-situ fluorination process fluorination conditions may be controlled to achieve target M-O—F layer or metal fluoride thickness with controlled stresses. The controlled fluorination conditions may prevent particle generation from the M-O—F layer or metal fluoride layer.

It has been determined through experimentation that there is a first threshold layer thickness in the temporary M-O—F or metal fluoride layer beyond which particles are generated. Accordingly, in some embodiments the thickness of the M-O—F layer or metal fluoride layer is further controlled by periodically performing an etch back process. For example, the in-situ fluorination process may be performed at the beginning of each manufacturing process, and the etch back process may be performed after the manufacturing process has been performed a threshold number of times (e.g., 5 times, 10 times, 24 times, 30 times, etc.). The etch back process may also be performed as an in-situ process, which may periodically be performed at the end of the manufacturing process or at the beginning of the manufacturing process before the fluorination process.

Accordingly, in one embodiment at block 525 a determination is made as to whether to perform an etch back process. The determination may be made based on a thickness of the M-O—F or metal fluoride layer or other etch back criteria. In one embodiment, once the M-O—F layer or metal fluoride layer reaches a first threshold thickness that is less than a second threshold thickness at which particle generation occurs it is time to perform the etch back process. In one embodiment, the determination is made based on a count of a number of iterations of the manufacturing process that have been performed since the etch back process was last performed. For example, it may be known through testing how much thickness is added to the M-O—F layer or metal fluoride layer after each iteration of the in-situ fluorination process plus the manufacturing process. This information may be used to determine when the M-O—F layer or metal fluoride layer has reached the first threshold thickness and satisfied an etch back criterion.

Additionally or alternatively, particle count tests may be performed on substrates after processing. If a particle count for yttrium containing particles increases by a threshold amount (e.g., the number of yttrium containing particles reaches a threshold), then an etch back criterion is satisfied and a determination may be made that the etch back process should be performed.

If the etch back process is not to be performed (e.g., the M-O—F layer or metal fluoride layer has not reached the first threshold thickness or the threshold particle count has not been reached), then the method returns to block 505 and another substrate is loaded into the processing chamber for processing. If the etch back process is to be performed, then the method continues to block 530.

At block 530, the etch back process is performed. In one embodiment, the etch back process is performed after removal of the substrate from the processing chamber. This may prevent the etch back process from affecting the substrate. Alternatively, in some instances the etch back process may be performed as an in-situ process after the manufacturing process or before a subsequent manufacturing process on another substrate.

The etch back process is used to control a net thickness of the M-O—F layer or the metal fluoride layer. The etch back process is performed using a corrosive chemistry that can etch a metal fluoride or metal oxy fluoride. In one embodiment, the etch back process is performed using silicon tetra chloride ($SiCl_4$) gas or $SiCl_4$ plasma. The $SiCl_4$ reacts with the metal fluoride or M-O—F layer to form $SiF_x$, which is highly volatile and has a high vapor pressure (x may be any positive value). The $SiF_x$ may then react with the M-O—F or metal fluoride layer to form $MF_z$, which may then be pumped out of the processing chamber (z may be any positive value). In one embodiment, the etch back process is performed using a combination of $SiCl_4$ gas or plasma and $Cl_2$ gas or plasma. The addition of the $Cl_2$ to the $SiCl_4$ increases the etch back rate of the M-O—F layer or metal fluoride layer. In one embodiment, about 1-5 SCCM of the $SiCl_4$ and optionally 1-5 SCCM of $Cl_2$ is flowed into the processing chamber for a duration of 1-5 seconds. In one embodiment, about 1-2 SCCM of the $SiCl_4$ and optionally 1-2 SCCM of $Cl_2$ is flowed into the processing chamber for a duration of 1-3 seconds.

In one embodiment, the processing chamber is equipped with an optical emission spectroscopy (OES) device. During the etch back process a plasma is generated, where at least a portion of the plasma is from the M-O—F layer or metal fluoride layer that is being etched. The OES device can measure the intensity levels of various wavelengths of light output by the plasma. Based on the detection of the intensity levels of the various wavelengths of light, the OES device can detect an optical signature for $SiF_x$, which is being formed from the etching of the M-O—F or metal oxide by the $SiCl_4$. Additionally or alternatively, an optical signature of $YCl_x$ may be detected using OES (x may be any positive value). Once the M-O—F layer or metal fluoride layer is completely removed, $SiF_x$ and/or YCl will no longer be generated and the detected wavelength intensities will change. Accordingly, the OES device may detect when the M-O—F layer or metal fluoride layer has been removed. At this time the etch back process may be terminated and the gases/plasmas may be pumped out of the processing chamber. Additionally, the ratio of fluorine in the M-O—F layer or metal fluoride layer may decrease with depth, so that a lower amount of fluorine is present near the interface with the metal oxide coating. The OES device may detect this change in the amount of fluorine, and may trigger a termination of the etch back process when a certain optical signature is detected. The certain optical signature may be an optical signature that includes some amount of $SiF_x$ and/or YCl. Accordingly, the OES device may be used to perform a partial etch back that ensures that some portion of the M-O—F layer or metal fluoride layer still remains at the end of the etch back process.

Each of methods 300, 400 and 500 may cause a metal fluoride or a metal oxide coating and/or article to be at least partially converted into a metal oxy-fluoride (M-O—F) layer or coating. A yttrium oxy-fluoride layer or coating and other metal oxy-fluoride layers or coatings are shown to be stable and highly resistant to plasma erosion and to reaction with fluorine-based chemistries in testing. Additionally, Y—O—F coatings and other yttrium-based oxy-fluoride coatings are inert to attack from hydroxides (OH attack). Accordingly, yttrium hydroxide (Y(OH)) does not form when the Y—O—F coatings or layers are exposed to air. Tests have shown reduced particle levels when Y—O—F coatings are used on chamber components. Moreover, even in the presence of Cl*, Br*, F* and H* species, the etch rate of the Y—O—F coating is very stable and low as compared to a $YF_3$ coating.

Figure 6A:
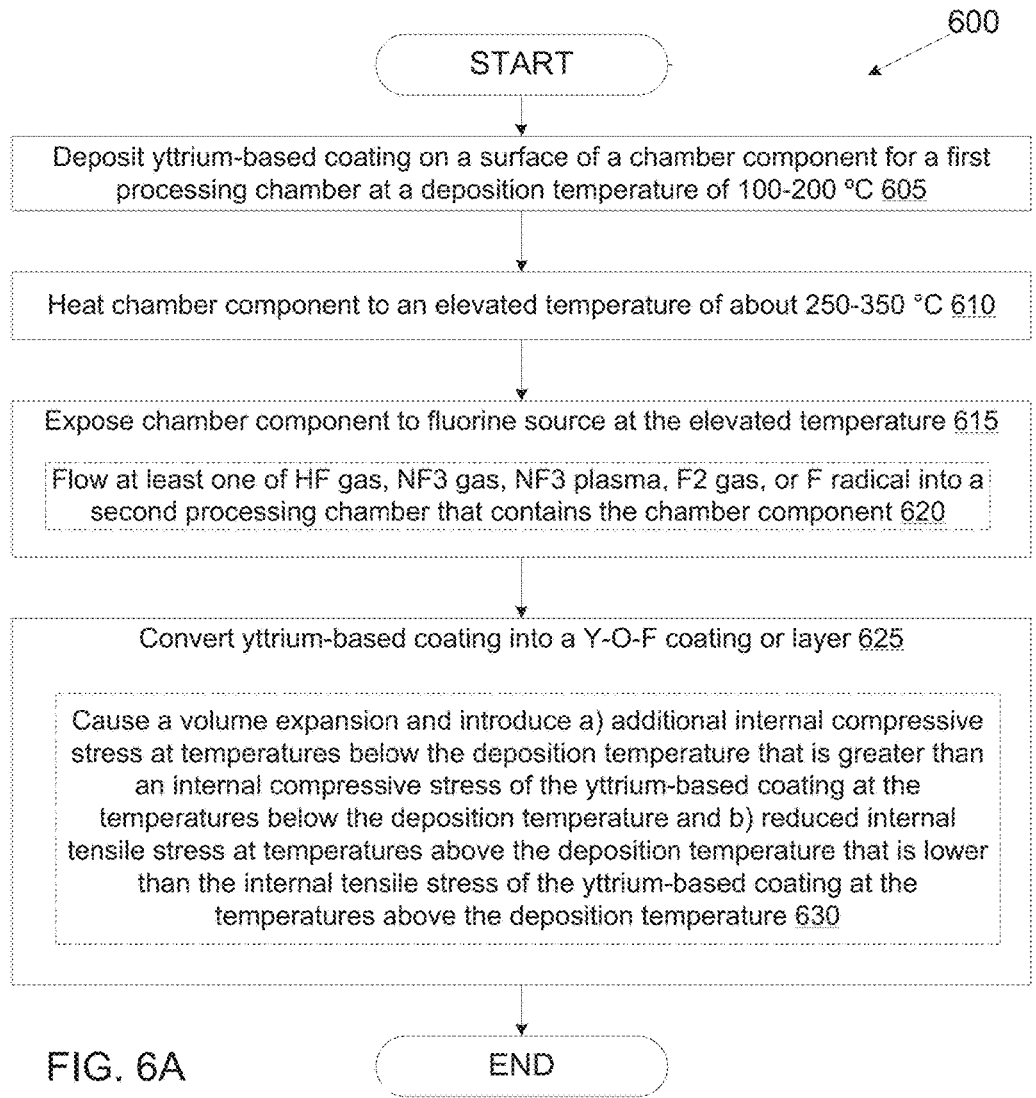
FIG. 6A illustrates a process for relieving the stress of a yttrium-based coating by converting the at least a portion of the yttrium-based coating into a Y—O—F coating or layer according to an embodiment.

FIG. 6A illustrates a process 600 for relieving the stress of a yttrium-based coating by converting at least a portion of the yttrium-based coating into a Y—O—F coating or layer (or other yttrium-based oxy-fluoride coating or layer) according to an embodiment. Process 600 is initially described with reference to converting a yttrium-based oxide coating into a yttrium-based oxy-fluoride coating. However, method 600 may also be performed to convert a yttrium-based fluoride coating into a yttrium-based oxy-fluoride coating. In embodiments, the chamber component may be a metal chamber component such as an aluminum component (e.g., made of pure aluminum or an aluminum alloy such as Al 6061) or a stainless steel component. Aluminum has a CTE of about 22-25 ppm/K, and stainless steel has a CTE of about 13 ppm/K. However, yttrium-based coatings have a significantly lower CTE (e.g., of about 6-8 ppm/K for $Y_2O_3$). Other oxides also generally have low CTEs. For example, $Al_2O_3$ has a CTE of 8 ppm/K. This difference in CTE between the yttrium-based coating and the chamber component can cause the yttrium-based coating to crack during thermal cycling. Dense coatings such as those produced by IAD, PVD, CVD and ALD are particularly prone to cracking during thermal cycling when formed over metal articles.

At block 605 of process 600, a yttrium-based coating is deposited on a surface of a chamber component for a first processing chamber. The yttrium-based oxide coating may be a $Y_2O_3$ coating, a coating consisting of a solid solution of $Y_2O_3$—$Er_2O_3$, a coating consisting of a solid solution of $Y_2O_3$—$ZrO_2$, or any of the other yttrium-based coatings discussed herein. In some embodiments, the yttrium-based coating includes an alternating stack of thicker $Y_2O_3$ layers and thinner layers of another metal oxide (e.g., of $ZrO_2$ or $Al_2O_3$). The thinner metal oxide layers may prevent crystal formation in the $Y_2O_3$ layers or may limit a size of crystals formed in the $Y_2O_3$ layers.

The yttrium-based coating may be a thin dense oxide coating deposited using an IAD deposition process, a physical vapor deposition (PVD) deposition process, a chemical vapor deposition (CVD) deposition process, or an ALD deposition process in embodiments. The yttrium-based coating may be deposited using a deposition temperature of around 100-300° C. in some embodiments. For example, the chamber component may be heated to the temperature of 100-200° C. during the deposition. Accordingly, the yttrium-based coating may have a "zero-stress state" at the deposition temperature of about 100-300° C., low compressive stress at room temperature, and high tensile stress at processing temperatures (operating temperatures). The deposition temperature may be governed by a deposition process that is performed and/or by properties of the chamber component. When the chamber component is at room temperature, the yttrium-based coating may be placed under a slight compressive stress due to the chamber component shrinking more than the yttrium-based coating as the chamber component cools below the deposition temperature. However, at processing temperatures greater than the deposition temperature the yttrium-based coating is placed under tensile stress due to the chamber component expanding more than the yttrium-based coating. The tensile stress can cause the yttrium-based coating to crack. The chamber component may later be used at an elevated process temperature of about 250-350° C. in embodiments. As a result, the yttrium-based coating will be placed under tensile stress during future processing due to a difference in a CTE between the yttrium-containing coating and the chamber component.

The yttrium-based coating may have a very low porosity of less than 1% in embodiments, and less than 0.1% in further embodiments, and about 0% in embodiments or porosity-free in still further embodiments. If ALD is performed to form the yttrium-based coating, the yttrium-based coating may have a thickness of less than an atom to a few atoms (e.g., 2-3 atoms) after a single full ALD deposition cycle. Multiple ALD deposition cycles may be implemented to deposit a thicker yttrium-based coating, with each deposition cycle adding to the thickness by an additional fraction of an atom to a few atoms. In embodiments, the yttrium-based coating may have a thickness of about 10 nm to about 1.5 µm. The yttrium-based coating may have a thickness of about 300 nm to about 500 nm in further embodiments.

In some embodiments, the yttrium-based coating includes a sequence of alternating layers of $Y_2O_3$ and an additional metal-containing oxide. For example, the yttrium-based coating may be a series of alternating layers of $Y_2O_3$ and $Al_2O_3$, a series of alternating layers of $Y_2O_3$ and $ZrO_2$, and so on. Using ALD, the chamber component may be introduced to one or more precursors for a duration until a surface of the chamber component is fully adsorbed with the one or more precursors to form an adsorption layer. Subsequently, the chamber component may be introduced to a reactant to react with the adsorption layer to grow a $Y_2O_3$ layer. This process may be repeated through approximately 5-10 cycles to grow the $Y_2O_3$ layer.

The chamber component having the $Y_2O_3$ layer may be introduced to one or more precursors for a duration until a surface of the $Y_2O_3$ layer is fully adsorbed with the one or more precursors to form an adsorption layer. Subsequently, the chamber component may be introduced to a reactant to react with the adsorption layer to grow an additional solid metal oxide layer. Accordingly, the additional metal oxide layer is fully grown or deposited over the $Y_2O_3$ layer using ALD. In an example, the precursor may be an aluminum containing precursor used in a first half cycle, and the reactant may be $H_2O$ used in a second half cycle. The metal oxide layer may be $ZrO_2$, $Al_2O_3$, or another oxide. This process may be performed once to grow a very thin metal oxide layer, which may have a thickness of less than a single atomic layer to a few atomic layers. For example, an $Al_2O_3$ monolayer grown by TMA and $H_2O$ typically has a growth rate of about 0.9-1.3 A/cycle while the $Al_2O_3$ lattice constant is a=4.7 A and c=13 A (for a trigonal structure).

The deposition of the $Y_2O_3$ layer and the additional metal oxide layer may be repeated n times to form a stack of alternating layers, where n is an integer value greater than 2. N may represent a finite number of layers selected based on the targeted thickness and properties. The stack of alternating layers may be considered as yttrium-based coating containing multiple alternating sub-layers.

The alternating layers described above may have a ratio of about 5:1 to 10:1 of the $Y_2O_3$ layer thickness to the additional metal oxide layer thickness in embodiments. Accordingly, the additional metal oxide layers may have a thickness that is ⅒ to ⅕ the thickness of the $Y_2O_3$ layers. In one embodiment, 8 ALD deposition cycles are performed for each $Y_2O_3$ layer and a single ALD deposition cycle is performed for each additional metal oxide layer. As a result, the $Y_2O_3$ layers may be amorphous. In another embodiment, 10 ALD cycles are performed for each $Y_2O_3$ layer and a single ALD deposition cycle is performed for each additional metal oxide layer. As a result, the $Y_2O_3$ layers may be nano-crystalline with a crystal size on the order of one or a few nanometers. Alternately, more or fewer ALD deposition cycles may be performed for the $Y_2O_3$ layers and/or for the additional metal oxide layers.

As described above, a $Y_2O_3$ layer is formed on the chamber component, followed by formation of an additional metal oxide layer, followed by formation of another $Y_2O_3$ layer, and so on. However, in other embodiments the first layer may be the additional metal oxide layer, and the next layer may be the $Y_2O_3$ layer, followed by another additional metal oxide layer, and so on.

In one embodiment, a stress relief layer (e.g., of amorphous $Al_2O_3$ or another amorphous ceramic) is deposited prior to deposition of the yttrium-based coating. The stress relief layer may be deposited using the same deposition technique as, or a different deposition technique from, the yttrium-based coating. In an example where the stress relief layer is an alumina ($Al_2O_3$) stress relief layer, ALD may be performed and the chamber component may be introduced to a first precursor (e.g., trimethyl aluminum (TMA)) for a first duration until all reactive sites on a surface of the chamber component are consumed and an Al containing adsorption layer is formed in a first half reaction. The remaining first precursor is flushed away and then a first reactant of $H_2O$ may be injected into a reactor containing the chamber component to start a second half cycle. A stress relief layer of $Al_2O_3$ is formed after $H_2O$ molecules react with the Al containing adsorption layer created by the first half reaction.

The stress relief layer may be uniform, continuous and conformal. The stress relief layer may be porosity free (e.g., have a porosity of 0) or have an approximately 0 porosity in embodiments (e.g., a porosity of 0% to 0.01%). Multiple full ALD deposition cycles may be implemented to deposit a thicker stress relief layer, with each full cycle (e.g., including introducing precursor, flushing, introducing reactant, and again flushing) adding to the thickness by an additional fraction of an atom to a few atoms. In embodiments, the stress relief layer may have a thickness of about 10 nm to about 1.5 μm.

At block 610, the chamber component is heated to an elevated temperature of about 250-500° C. (e.g., about 250-350° C.). At block 615, the chamber component is exposed to a fluorine source at the elevated temperature for a time period. The time period may be about 0.1 hour to about 72 hours in embodiments. In further embodiments, the time period may be about 12-24 hours or about 1-12 hours. The fluorine source may be HF gas, $NF_3$ gas, $NF_3$ plasma, $F_2$ gas, F radicals in a gas, or other fluorine sources as set forth at block 620.

At block 625, the yttrium-based coating is converted to a M-O—F coating or layer. The F atoms diffuse into the yttrium-based coating, react with the $Y_2O_3$ in the coating, and form Y—O—F and possible other fluorinated phases. The depth and percentage of the conversion can be controlled by parameters such as process time, temperature, type of F containing gas, gas pressure and chamber pressure, for example. The target depth and percentage of the yttrium-based oxide coating that is to be converted to M-O—F may depend on the difference between the deposition temperature and the operating or processing temperature to adjust the "zero-stress state" for the coating. For example, if the yttrium-based coating is a $Y_2O_3$ coating, then an entirety of the $Y_2O_3$ coating may be converted to Y—O—F. If the yttrium-based coating is an alternating stack of $Y_2O_3$ layers and additional metal oxide layers, then the $Y_2O_3$ layers may be converted to Y—O—F layers and the additional metal oxide layers may be converted to M-O—F layers. In some instances the additional metal oxide layers may be so thin that their material composition does not change as a result of the fluorination process. Accordingly, the $Y_2O_3$ layers may convert to Y—O—F layers and the additional metal oxide layers may be unchanged.

Compared to $Y_2O_3$, $YO_xF_y$ has a larger molar volume (x and y may be positive values). Depending on values of x and y, the $YO_xF_y$ molar volume is between the $YF_3$ molar volume of 36.384 $cm^3$/mol and the ½ $Y_2O_3$ form molar volume of 22.5359 $cm^3$/mol. The conversion of the yttrium-based coating to a Y—O—F coating or layer (e.g., $YO_xF_y$) causes a volume expansion and introduces additional internal compressive stress at temperatures below the deposition temperature that is greater than an internal compressive stress of the yttrium-based coating at the temperatures below the deposition temperature. Thus the zero stress state of the coating on a metal chamber component or other article is shifted to a higher temperature. Accordingly, when the chamber component is heated to an elevated processing temperature that is above the deposition temperature, the M-O—F coating or layer (e.g., Y—O—F coating or layer) has a reduced internal tensile stress that is lower than the internal tensile stress of the yttrium-based coating at the temperatures above the deposition temperature. The volume expansion is because $YF_3$ has a molar volume that is about 60% larger than the molar volume of $Y_2O_3$. The molar volume of Y—O—F is between the molar volume of $YF_3$ and the molar volume of $Y_2O_3$. The reduced tensile stress can reduce or eliminate cracking of the Y—O—F coating. The Y—O—F is a plasma resistant coating that is resistant to erosion and corrosion by fluorine based plasmas.

Process 600 has been described to increase compressive stress for yttrium-based coatings on chamber components having a higher CTE than the CTE of the yttrium-based coatings. However, a similar process may also be performed to reduce the compressive stress for yttrium-based coatings on chamber components having a lower CTE than the CTE of the yttrium-based coatings. For example, the chamber component may be graphite (having a CTE of about 4 ppm/K), AlN (having a CTE of about 4.6 ppm/K), SiC (having a CTE of about 3.7 ppm/K) or SiN (having a CTE of about 2.8 ppm/K). In such instances, it may be desirable to reduce the compressive stress in the yttrium-based coatings. This may be accomplished, for example, by starting with deposition of a $YF_3$ or other yttrium-based fluoride coating at block 605. Then at block 615 the chamber component may be exposed to an oxygen source (e.g., any of the oxygen sources described herein above) to convert the yttrium-based fluoride coating into a Y—O—F coating or layer or other yttrium-based oxy-fluoride coating or layer. Exposure to the oxygen source (e.g., $O_2$ plasma and/or $O_2$ radicals) may be performed at a temperature of 200-300° C. in embodiments. The conversion of $YF_3$ to Y—O—F (or of another yttrium-based fluoride to a yttrium-based oxy-fluoride) may cause a volume contraction (e.g., due to a decrease in the molar volume), which may introduce tensile stress and/or reduce the compressive stress at room temperature and/or at an elevated processing temperature. Accordingly, process 600 may be performed to modulate the stress in a yttrium-based oxide coating or in a yttrium-based fluoride coating. Examples of yttrium-based fluoride coatings that may be converted to yttrium-based oxy-fluoride coatings are provided above with reference to FIG. 4A.

Figure 6B:
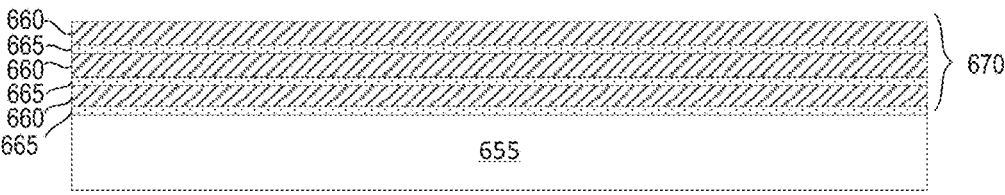
FIG. 6B illustrates a cross sectional side view of a chamber component that includes a Y—O—F/M-O—F coating on a body of a chamber component according to an embodiment.

FIG. 6B illustrates a cross sectional side view of a chamber component 650 that includes a Y—O—F/M-O—F coating 670 on a body 655 of the chamber component 650 according to an embodiment. The chamber component 650 may have a metal body (e.g., aluminum, an aluminum alloy such as Al 6061 or Al 6063, stainless steel such as SST316L, etc.) or a ceramic body (e.g., $Al_2O_3$, AlN, SiC, etc.). The Y—O—F/M-O—F coating 670 may include an alternating stack of thicker Y—O—F layers 660 and thinner M-O—F layers 665. Alternatively, the thinner layers may be M layers.

FIG. 7A illustrates a cross sectional side view of a chamber component 710 that includes a $Y_2O_3$ coating 705 as viewed by a transmission electron microscope (TEM), according to an embodiment. A capping layer 715 has been placed over the $Y_2O_3$ coating 705 for purpose of generating the TEM image. A surface A1 represents a top of the $Y_2O_3$ coating 705 and a surface B1 represents an interface between the chamber component 710 and the $Y_2O_3$ coating 705.

FIG. 7B illustrates a material composition of the chamber component of FIG. 7A. As shown, the capping layer 715 is composed of Ir. The $Y_2O_3$ coating 705 is composed of yttrium 725 and oxygen 720. The chamber component 710 is composed of Si 735.

FIG. 8A illustrates a cross sectional side view of a chamber component 810 that includes a Y—O—F coating 805 after a fluorination process as viewed by a transmission electron microscope (TEM), according to an embodiment. The fluorination process was performed at 500° C. using $NF_3$ plasma with a power of 200 W for a duration of about 12 hours. A capping layer 815 has been placed over the Y—O—F coating 805 for purpose of generating the TEM image. A surface A2 represents a top of the Y—O—F coating 805 and a surface B2 represents an interface between the chamber component 810 and the Y—O—F coating 805. A strain measurement by x-ray diffraction (XRD) showed an increased strain of about 1.34+/−0.13% at room temperature and a crystallite size of 11.4+/−1.5 nm, which equates to increased compressive stress at room temperature. In comparison, the yttria coating without the fluorination process had a strain of 0.22+/−0.14% and a crystallite size of 6.1+/−0.5 nm at room temperature. The higher compressive stress at room temperature of the Y—O—F coating results in a lower film stress for this coating at operating temperatures (e.g., of around 100° C. or above).

FIG. 8B illustrates a material composition of the chamber component of FIG. 8A. As shown, the capping layer 815 is composed of Ir. The Y—O—F coating 805 is composed of yttrium 825, oxygen 820 and fluorine 840. The chamber component 810 is composed of Si 835. As shown, the Y—O—F coating 805 includes about 30-50 at. % F, about 20-30 at. % O and about 30-40 at. % Y, depending on the depth of the coating. The fluorination process has replaced O molecules with F molecules throughout what had been the $Y_2O_3$ coating 705.

Figure 9A:
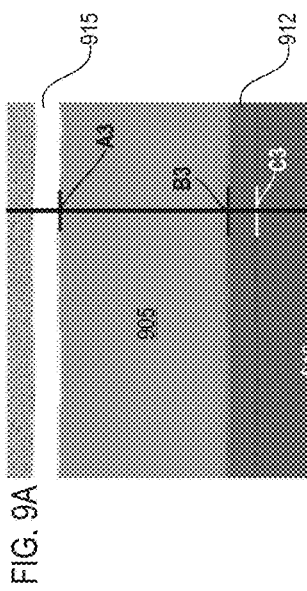
FIG. 9A illustrates a cross sectional side view of a chamber component that includes an alternating stack of Y—O—F layers and Al—O—F layers after a fluorination process as viewed by a TEM, according to an embodiment.

FIG. 9A illustrates a cross sectional side view of a chamber component 910 that includes a yttrium-based oxy-fluoride coating 905 made up of an alternating stack of Y—O—F layers and Al—O—F layers after a fluorination process as viewed by a transmission electron microscope (TEM), according to an embodiment. The ytrrium-based oxy-fluoride coating was produced by fluorination of a yttrium-based oxide coating that included an alternating stack of $Y_2O_3$ layers and $Al_2O_3$ layers. The fluorination process may be performed at 250° C. A capping layer 915 has been placed over the yttrium-based oxide coating 905 for purpose of generating the TEM image. A surface A3 represents a top of the yttrium-based oxide coating 905, a surface B3 represents an interface between the yttrium-based oxide coating 905 and an alumina stress relief layer 912, and a surface C3 represents an interface between the alumina stress relief layer 912 and the chamber component 910.

Figure 9B:
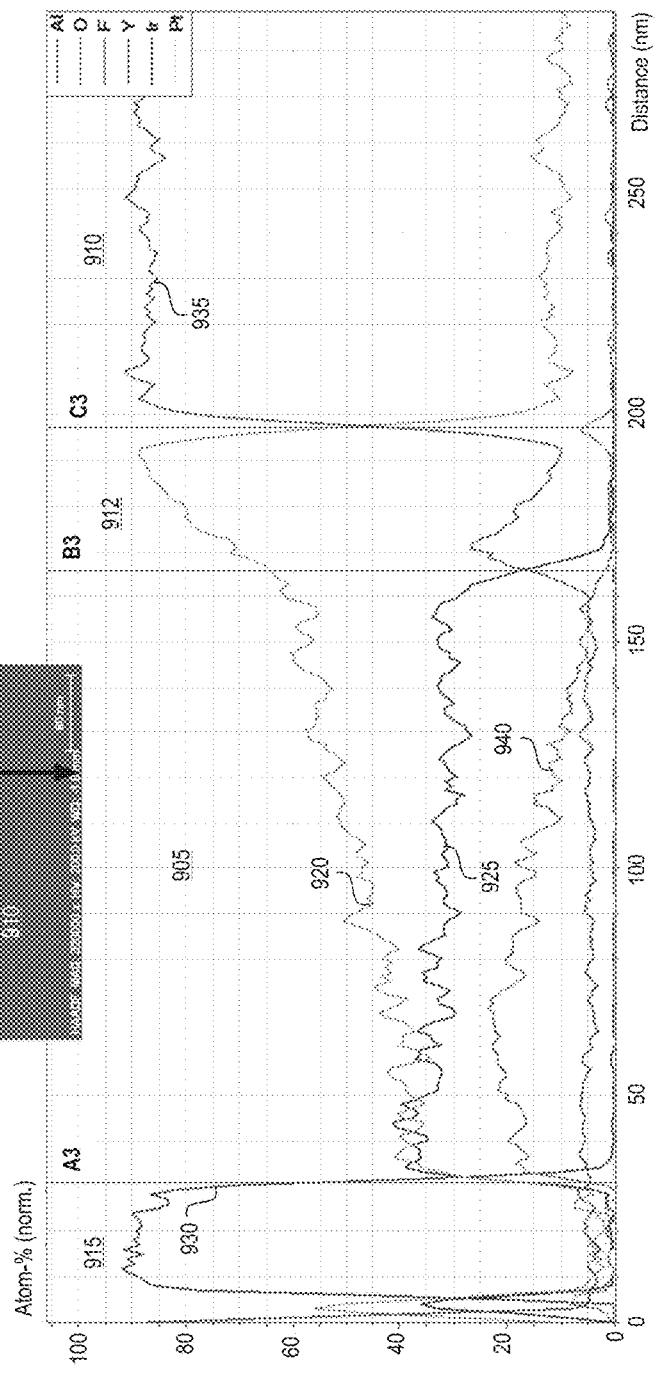
FIG. 9B illustrates a material composition of the chamber component of FIG. 9A.

FIG. 9B illustrates a material composition of the chamber component of FIG. 9A. As shown, the capping layer 915 is composed of Ir. The yttrium-based oxide coating 905 is composed of yttrium 925, oxygen 920, fluorine 940 and aluminum 935. The stress relief layer is composed of oxygen 920 and aluminum 935. The chamber component 810 is composed of a different ratio of aluminum 935 and oxygen 920.

Prior to fluorination, the yttrium-based oxy-fluoride coating 905 was a yttrium-based oxide coating that included an alternating stack of $Y_2O_3$ layers and $Al_2O_3$ layers. The $Y_2O_3$ layers may be approximately 2-12 times thicker than the $Al_2O_3$ layers in some embodiments. Some example thickness ratios of the rare earth oxide sub-layers to the additional metal oxide sub-layers include 2:1, 3:1, 4:1, 5:1, 8:1, 10:1 and 12:1. In some embodiments, $Y_2O_3$ layers are formed using about 5-12 cycles of an ALD process, where each cycle forms a nanolayer (or slightly less or more than a nanolayer) of the rare earth metal-containing oxide. Each layer of $Al_2O_3$ may be formed from a single ALD cycle (or a few ALD cycles) and may have a thickness of less than an atom to a few atoms. Layers of $Y_2O_3$ may each have a thickness of about 5-100 angstroms, and layers of the $Al_2O_3$ may each have a thickness of about 1-20 angstroms in embodiments. In the illustrated embodiment, a thickness ratio of the $Y_2O_3$ layers to the $Al_2O_3$ layers is about 10:1. The $Al_2O_3$ layers may prevent the $Y_2O_3$ layers from becoming crystalline in embodiments. As a result of the additional $Al_2O_3$ layers, the $Y_2O_3$ layers remain in a polycrystalline state.

As a result of the fluorination, the $Y_2O_3$ layers were converted into Y—O—F layers and the $Al_2O_3$ layers were converted into Al—O—F layers. Alternatively, some or all of the $Al_2O_3$ layers may not be converted into Al—O—F layers. As shown, the at. % of fluorine varies from about 2 at. % to about 25 at. %. The concentration of F is greater near a surface of the coating and less near a bottom of the coating.

Figure 10A:
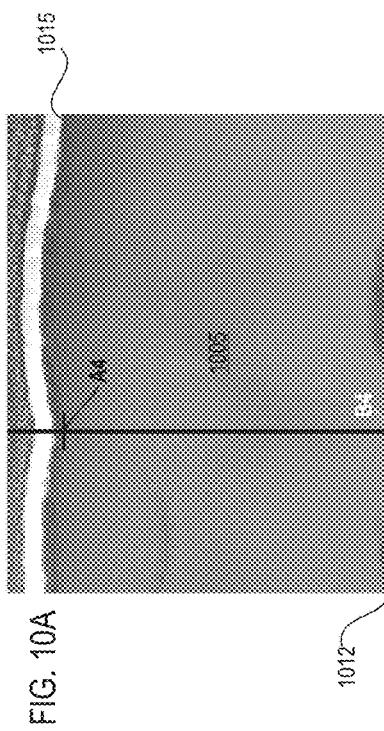
FIG. 10A illustrates a cross sectional side view of a chamber component that includes an alternating stack of Y—O—F layers and Al—O—F layers after a fluorination process as viewed by a TEM, according to an embodiment.

FIG. 10A illustrates a cross sectional side view of another chamber component that includes a yttrium-based oxy-fluoride coating 1005 that includes an alternating stack of Y—O—F layers and Al—O—F layers after a fluorination process as viewed by a transmission electron microscope (TEM), according to an embodiment. The coating was created by fluorination of an ALD coating comprising an alternating stack of $Y_2O_3$ layers and $Al_2O_3$ layers. The coating 1005 has a thickness of about 500 nm. A capping layer 1015 has been placed over the yttrium-based oxy-fluoride coating 1005 for purpose of generating the TEM image. A surface A4 represents a top of the yttrium-based oxy-fluoride coating 1005, a surface B4 represents an interface between the yttrium-based oxy-fluoride coating 1005 and an alumina stress relief layer 1012, and a surface C4 represents an interface between the alumina stress relief layer 1012 and the chamber component 1010.

Figure 10B:
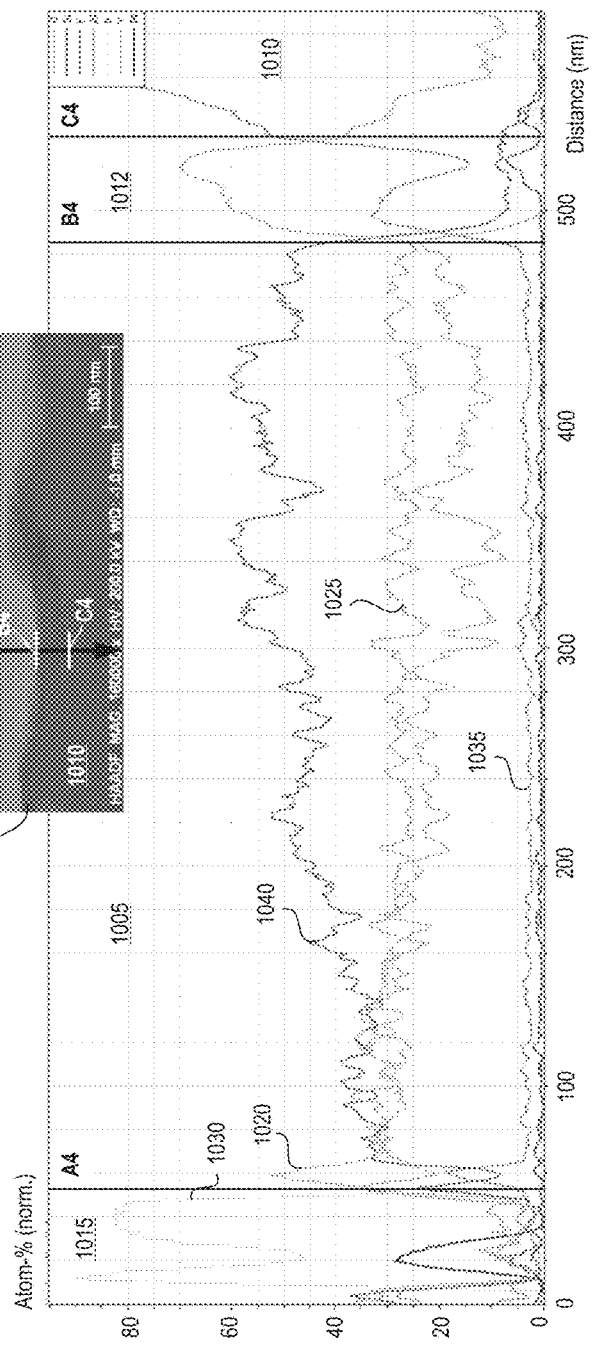
FIG. 10B illustrates a material composition of the chamber component of FIG. 10A.

FIG. 10B illustrates a material composition of the chamber component of FIG. 10A. As shown, the capping layer 1015 is composed of Ir. The yttrium-based oxy-fluoride coating 1005 is composed of yttrium 1025, oxygen 1020, fluorine 1040 and aluminum 1035. The stress relief layer is composed of oxygen 1020 and aluminum 1035. The chamber component 1010 is composed of a different ratio of aluminum 1035 and oxygen 1020. The fluorination process used to create the yttrium-based oxy-fluoride coating 1005 was a remote inductively coupled plasma (ICP) process at 450° C. using $NF_3$ plasma. As shown, an entire yttrium-based oxide coating was converted into the yttrium-based oxy-fluoride coating 1005. The fluorine concentration in the coating 1005 varies from about 35 at. % to about 60 at. %, and varies by depth. Notably, under these process conditions the fluorine concentration is greater near the middle and bottom of the coating 1005 than at a top of the coating 1005. Diffraction analysis showed that the Y—O—F layers of the coating 1005 remained polycrystalline after the fluorination process.

FIG. 11A illustrates a cross sectional side view of a chamber component that is a solid sintered (bulk) ceramic 1105 composed of a $Y_2O_3$—$ZrO_2$ solid solution after a fluorination process as viewed by a transmission electron microscope (TEM), according to an embodiment. A capping layer 1015 has been placed over the solid sintered ceramic 1105 for purpose of generating the TEM image. A surface A5 represents a top of the solid sintered ceramic 1105.

FIG. 11B illustrates an EDS line scan showing material composition of the chamber component of FIG. 11A. As shown, approximately the top 70 nm of the solid sintered ceramic 1105 was converted from a $Y_2O_3$—$ZrO_2$ solid solution to Y—Zr—O. The EDS line scan shows concentrations of oxygen 1120, fluorine 1140, yttrium 1125, and zirconium 1150. The $Y_2O_3$—$ZrO_2$ solid solution initially contained about 60 mol % $Y_2O_3$ and about 40 mol % $ZrO_2$, which resulted in an energy dispersive electroscopy (EDS) line scan (as shown in FIG. 11A) showing about 23 at. % Y, about 65 at. % O and about 12 at. % Zr. After fluorination, the fluorine concentration varied from about 5 at. % to about 30 at. % in the top 100 nm of the solid sintered ceramic 1105. Processing conditions for the fluorination include direct capacitively coupled plasma (CCP) of $NF_3$ plasma at 200 W plasma power and 450° C. for 2 hours of processing. Fluorination of the $Y_2O_3$—$ZrO_2$ solid solution is slowed by Zr occupying vacancies in the Y lattice. The fluorine concentration and depth of fluorination may be increased by increasing the processing time and/or the density of fluorine radicals in the plasma.

Fluorination was also performed on other bulk sintered ceramic articles and coatings using similar test conditions of direct CCP of $NF_3$ plasma at 200 W plasma power and 450° C. for 2 hours of processing. Fluorination under these conditions of a 100 nm $Y_2O_3$ ALD coating produced using a first Y precursor resulted in the entire coating converting to a Y—O—F coating with a fluorine concentration that varied from about 25 at. % to about 55 at. %. Oxygen was found to be nearly depleted at a surface of the coating, resulting in a nearly $YF_3$ layer at the surface. Fluorine concentration then gradually decreased with depth. Fluorination under these conditions of another 100 nm $Y_2O_3$ ALD coating that was produced using a second Y precursor resulted in the entire coating converting to a Y—O—F coating with a fluorine concentration that varied from about 20 at. % to about 30 at. %. Fluorine concentration was found to be slightly higher in the bottom half of the coating than the top half of the coating. There was found to be a slight microstructure difference between the $Y_2O_3$ ALD coating produced using the first Y precursor and the $Y_2O_3$ ALD coating produced using the second Y precursor, which resulted in unexpected differences in fluorination.

Fluorination was performed on a 100 nm $Al_2O_3$ ALD coating under conditions of direct CCP of $NF_3$ plasma at 200 W plasma power and 450° C. for 2 hours of processing. Such fluorination resulted in fluorination of approximately the top 20 nm of the coating. The fluorine concentration at the top 20 nm of the coating was about 5-7 at. % F. Accordingly, the top 20 nm converted to an Al—O—F coating with about 35 at. % Al, 5-7 at. % F and 58-60 at. % O.

Fluorination was performed on a bulk sintered $Y_2O_3$ article under conditions of direct CCP of $NF_3$ plasma at 200 W plasma power and 450° C. for 2 hours of processing. Such fluorination resulted in fluorination of approximately the top 150 nm of the article. The fluorine concentration was about 30-40 at. % at the top 50 nm, and gradually decreased to about 5 at. % near 150 nm depth.

FIG. 12A illustrates a cross sectional side view of a chamber component 1265 that includes a coating 1205 of $Al_2O_3$ on an $SiO_2$ substrate 1265 after a fluorination process as viewed by a transmission electron microscope (TEM), according to an embodiment. A capping layer 1215 has been placed over the coating 1205 for purpose of generating the TEM image. A surface A6 represents a top of the coating 1205. A surface B6 represents a bottom of the coating 1205 and a top of the chamber component 1265.

FIG. 12B illustrates an EDS line scan showing a material composition of the chamber component of FIG. 12A. As shown, approximately the top 50 nm of the coating 1205 was converted from $Al_2O_3$ into Al—O—F. The $Al_2O_3$ initially contained about 63-67 at. % Al and about 33-37 at. % O, which resulted in the EDS line scan as shown in FIG. 12B. The EDS line scan shows concentrations of aluminum 1220, oxygen 1260, and fluorine 1240. After fluorination, the fluorine concentration varied from about 15 at. % at surface A6 to about 5 at. % or less at 50 nm depth. Processing conditions for the fluorination include direct CCP of $CF_3$/Ar plasma at 450 W plasma power for 5 hours of processing. Notably, fluorination of $Al_2O_3$ is significantly slower than fluorination of $Y_2O_3$. The fluorine concentration and depth of fluorination may be increased by increasing the processing time and/or the density of fluorine radicals in the plasma.

Fluorination was also performed on other bulk sintered ceramic articles and coatings using similar test conditions of direct CCP of $CF_3$/Ar plasma at 450 W plasma power for 1-5 hours of processing. Fluorination under these conditions of a 100 nm $Al_2O_3$ ALD coating for 5 hours of processing resulted in the top 10-15 nm of the coating converting to Al—O—F with a fluorine concentration of 3-30 at. %, where the fluorine concentration was about 30 at. % at a depth of about 3-5 nm. Fluorination under these conditions of a 100 nm $Y_2O_3$ ALD coating for a duration of 5 hours resulted in fluorination of approximately the top 70 nm of the coating. The $Y_2O_3$ coating converted to a Y—O—F coating with a fluorine concentration of about 3-25 at. %, where the fluorine concentration was about 25 at. % at a depth of about 4-5 nm and the fluorine concentration at a depth of about 10-70 nm was around 5-10 at. %. Fluorination under these conditions of a 5 μm $Y_2O_3$ ALD coating for a duration of 5 hours resulted in fluorination of about the top 70 nm of the coating. The $Y_2O_3$ coating converted to a Y—O—F coating with a fluorine concentration of about 5-20 at. %, where the fluorine concentration was about 20 at. % at a depth of about 8-10 nm and gradually decreased with increased depth.

Fluorination was performed on a bulk sintered article composed of a composite ceramic comprising a first phase of $Y_2Al_4O_9$ and a second phase of a $Y_2O_3$—$ZrO_2$ solid solution under conditions of direct CCP plasma with $CF_3$/Ar plasma at 450 W plasma power for 5 hours of processing. Such fluorination resulted in fluorination of approximately the top 20 nm of the article. Lamella originally having the first phase of $Y_2Al_4O_9$ were converted to Y—Al—O—F by the fluorination process, while lamella originally having the second phase of a $Y_2O_3$—$ZrO_2$ solid solution converted to Y—Zr—O—F by the fluorination process. The concentration of the fluorine in the lamella originally having the second phase was about 4-18 at. %.

Figure 13B:
FIG. 13B illustrates a Y—Z—O—F coating resulting from fluorination of a $Y_2O_3$—$ZrO_2$ solid solution coating, according to an embodiment.
Figure 13A:
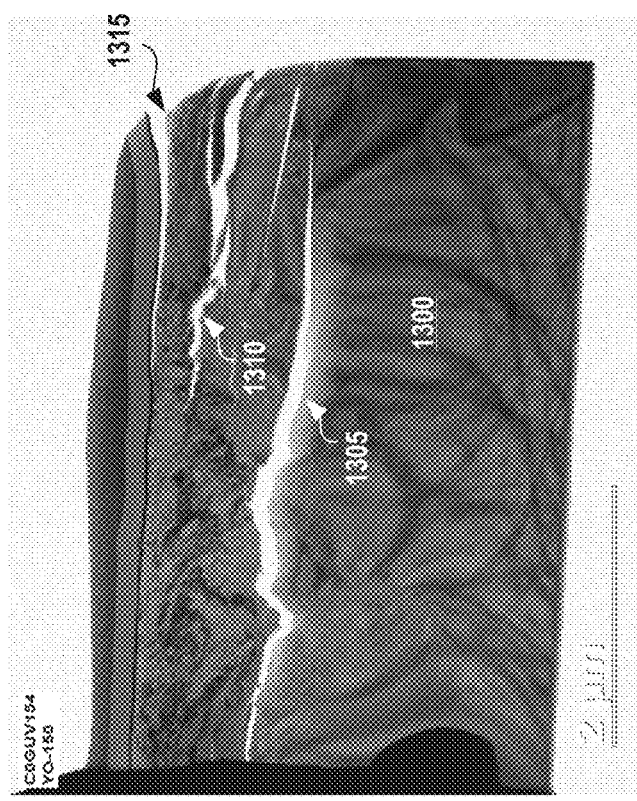
FIG. 13A illustrates a Y—O—F coating resulting from fluorination of a $Y_2O_3$ coating, according to an embodiment.

FIG. 13A illustrates a Y—O—F layer 1300 resulting from fluorination of a $Y_2O_3$ coating. The fluorination was performed using a remote fluorine plasma source. The Y—O—F layer 1300 has a thickness of 138-182 nm. As shown, the Y—O—F layer includes cracks 1305, 1310 and delamination 1315. Such cracks 1305, 1310 and delamination 1315 can be mitigated by slowing down the fluorination process.

FIG. 13B illustrates a Y—Z—O—F layer 1320 resulting from fluorination of a $Y_2O_3$—$ZrO_2$ solid solution coating. The illustrated Y—Z—O—F layer 1320 is based on fluorination of a $Y_2O_3$—$ZrO_2$ that includes 60 mol % $Y_2O_3$ and 40 mol % $ZrO_2$. However, similar results are achieved using 70 mol % $Y_2O_3$ and 30 mol % $ZrO_2$. The Y—Z—O—F layer has a thickness of about 32-60 nm. As shown, the Y—Z—O—F layer 1320 does not include any cracking or delamination. It was discovered that a $Y_2O_3$—$ZrO_2$ solid solution reacts with a fluorine source at a slower rate than $Y_2O_3$. Additionally, the microstructural integrity of a fluorinated $Y_2O_3$—$ZrO_2$ solid solution coating (e.g., a Y—Z—O—F layer 1320) has been shown to possess a superior microstructural integrity that lacks cracking and delamination. As a result, the Y—Z—O—F layer 1320 provides improved particle performance (reduced numbers of yttrium based particles on processed substrates) and longer useful lifetimes.

Figure 14:
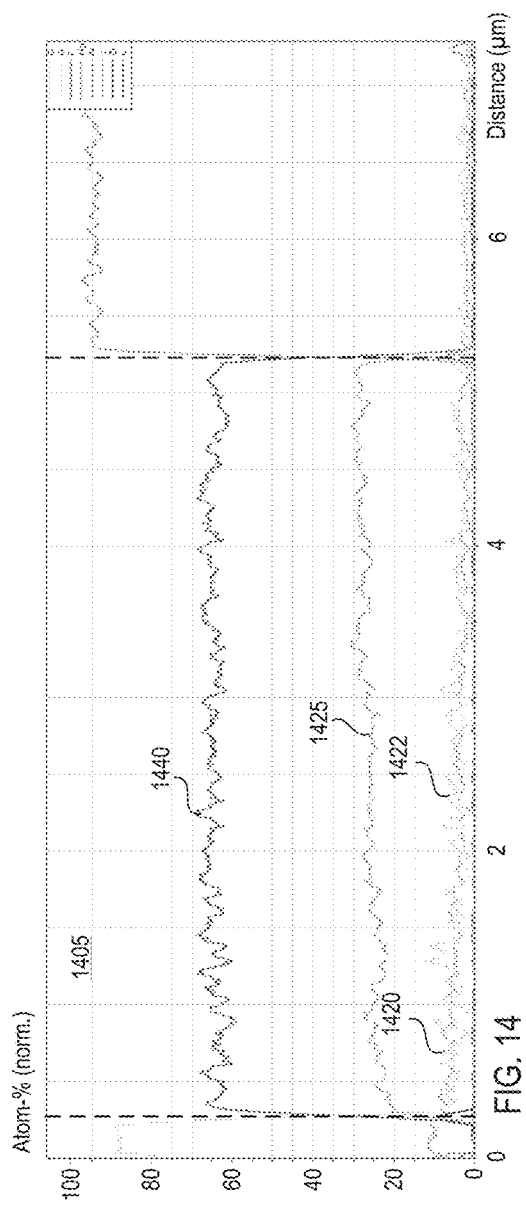
FIG. 14 illustrates an energy dispersive electroscopy (EDS) line scan showing the material composition of a $YF_3$ coating.

FIG. 14 illustrates an energy dispersive electroscopy (EDS) line scan showing the material composition of a $YF_3$ 1405 coating. As shown, the $YF_3$ coating 1405 includes approximately 25-30 at. % Y 1425 and about 60-70 at. % F 1440. The $YF_3$ coating additionally includes about 3-6 at. % F 1420 and about 2-10 at. % C 1422. The $YF_3$ coating was deposited by IAD and has a thickness of about 5 μm.

Figure 15:
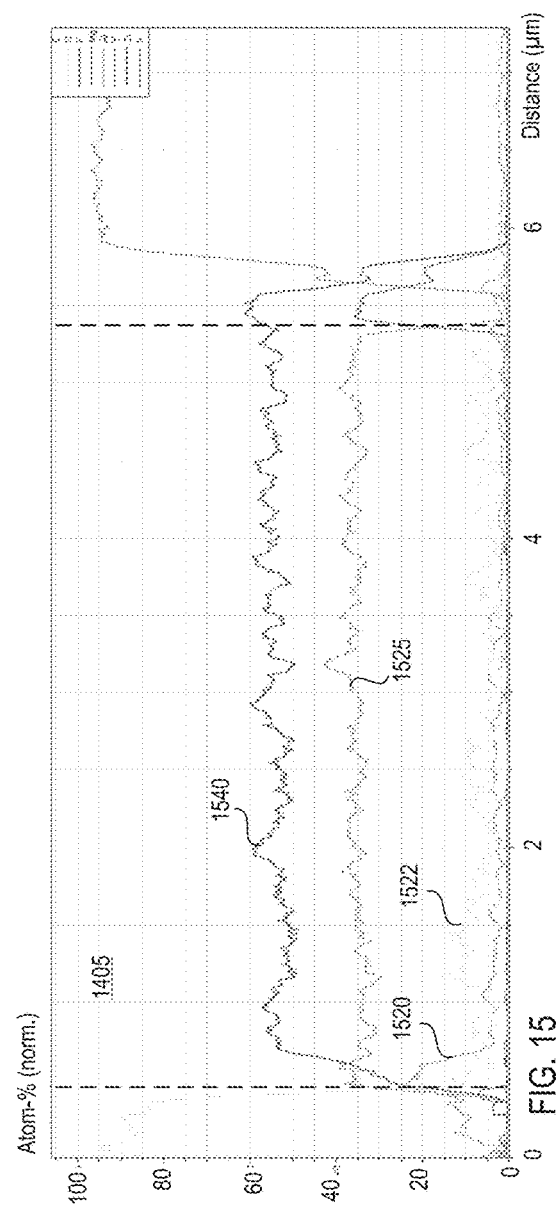
FIG. 15 illustrates an EDS line scan showing the material composition of the $YF_3$ coating of FIG. 14 after an oxidation process, where the $YF_3$ coating includes a Y—O—F layer, according to an embodiment.

FIG. 15 illustrates an EDS line scan showing the material composition of the $YF_3$ coating 1405 of FIG. 14 after an oxidation process, where the $YF_3$ coating 1405 includes a Y—O—F layer, according to an embodiment. The oxidation process was performed at processing conditions of a microwave O plasma at 50 W of plasma power and at about 350° C. The O plasma was flowed with Ar at a ratio of 1:1. As shown, the oxidation process converted about the top 500 nm of the $YF_3$ into a Y—O—F layer. The concentration of O 1520 in the Y—O—F layer is about 10-30 at. % and the concentration of F 1540 is about 30-50 mol. %, with a higher O concentration at the surface of the $YF_3$ coating 1405. The concentration of C 1522 is approximately unchanged.

Figure 16A:
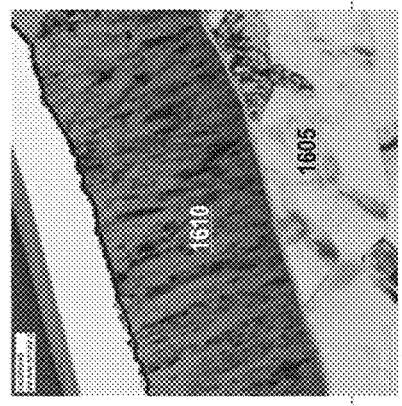
FIG. 16A illustrates a cross sectional side view of a chamber component that includes a coating of $Y_2O_3$ after a fluorination process in a HF acid solution as viewed by a TEM, according to an embodiment.

FIG. 16A illustrates a cross sectional side view of a chamber component 1605 that includes a coating of $Y_2O_3$ 1610 after a fluorination process in a HF acid solution as viewed by a TEM, according to an embodiment. The $Y_2O_3$ coating 1610 has a thickness of about 600 nm and was deposited by ALD. The fluorination process was performed using an acid solution that included approximately 49% HF with ultrasonic agitation for a process time of about 1 minute.

Figure 16B:
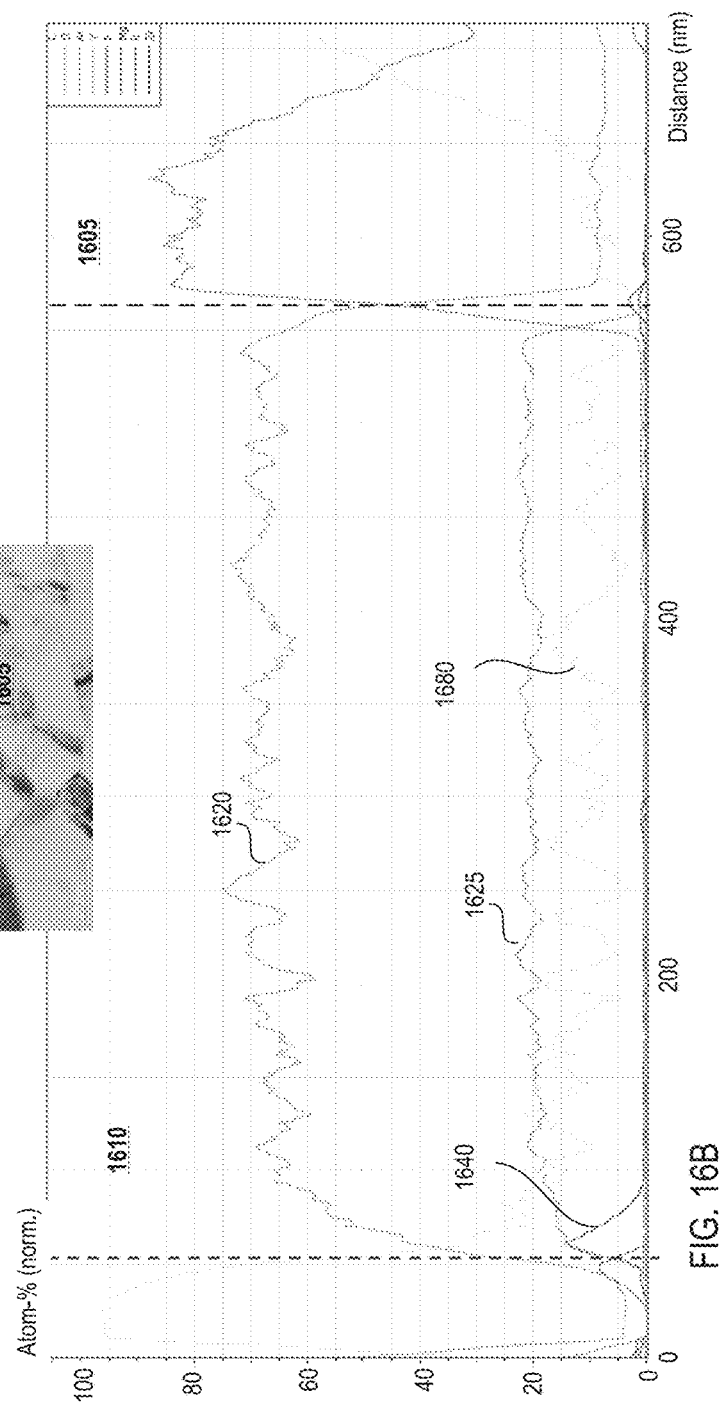
FIG. 16B illustrates a material composition of the chamber component of FIG. 16A.

FIG. 16B illustrates a material composition of the chamber component of FIG. 16A. As shown, the $Y_2O_3$ coating 1610 includes a Y—O—F layer having a thickness of about 50 nm at the top of the $Y_2O_3$ coating 1610. The concentration of F 1640 in the Y—O—F layer is about 3-15 at. %, with a higher F concentration near the surface. The $Y_2O_3$ coating 1610 additionally includes about 60-70 at. % O 1620 and about 19-24 at. % Y 1625. Additionally, the $Y_2O_3$ coating 1610 includes come C 1680.

A fluorination process was performed using an acid solution that included approximately 49% HF with ultrasonic agitation for a process time of about 1 minute on multiple different yttrium-based coatings. This fluorination process was performed on a 1 micron thick coating comprising alternating layers of $Y_2O_3$ and $Al_2O_3$ (with a thickness ratio of $Y_2O_3$ to $Al_2O_3$ of 10:1) that was deposited by ALD with zone control. As a result, the top 50 nm of the coating converted to Y—O—F with a fluorine concentration of about 5 at. %. The fluorination process with these conditions was also tested on a 600 nm thick $Y_2O_3$ coating that was deposited by ALD without zone control. As a result, the top 500 nm of the coating converted to Y—O—F with a fluorine concentration of about 18 at. %. The fluorination process with these conditions was also tested on a 50 nm coating composed of a $Y_2O_3$—$ZrO_2$ solid solution. As a result, the top 25 nm of the coating converted to Y—Zr—O—F with a fluorine concentration of about 5 at. %.

In another embodiment, a fluorination process was performed using an acid solution that included approximately 0.5 vol. % HF, 0.5 mol % $NH_4F$, 10 vol. % $H_2O_3$ and the remainder water for a duration of 1 minute with ultrasonication of the acid solution on different yttrium-based coatings. The fluorination process with these conditions was tested on a 1 micron thick coating comprising alternating layers of $Y_2O_3$ and $Al_2O_3$ (with a thickness ratio of $Y_2O_3$ to $Al_2O_3$ of 10:1) that was deposited by ALD with zone control. As a result, the top 50 nm of the coating converted to Y—O—F with a fluorine concentration of about 1 at. %. The fluorination process with these conditions was also tested on a 600 nm thick $Y_2O_3$ coating that was deposited by ALD without zone control. As a result, the top 25 nm of the coating converted to Y—O—F with a fluorine concentration of about 2.5 at. %. The fluorination process with these conditions was also tested on a 50 nm coating composed of a $Y_2O_3$—$ZrO_2$ solid solution. As a result, the top 25 nm of the coating converted to Y—Zr—O—F with a fluorine concentration of about 1 at. %.

A fluorination process was performed and a $Y_2O_3$ coating was exposed to a fluorine-based acid solution. This acid-based fluorination recipe was used to test a 1 micron thick $Y_2O_3$ coating.

Figure 17:
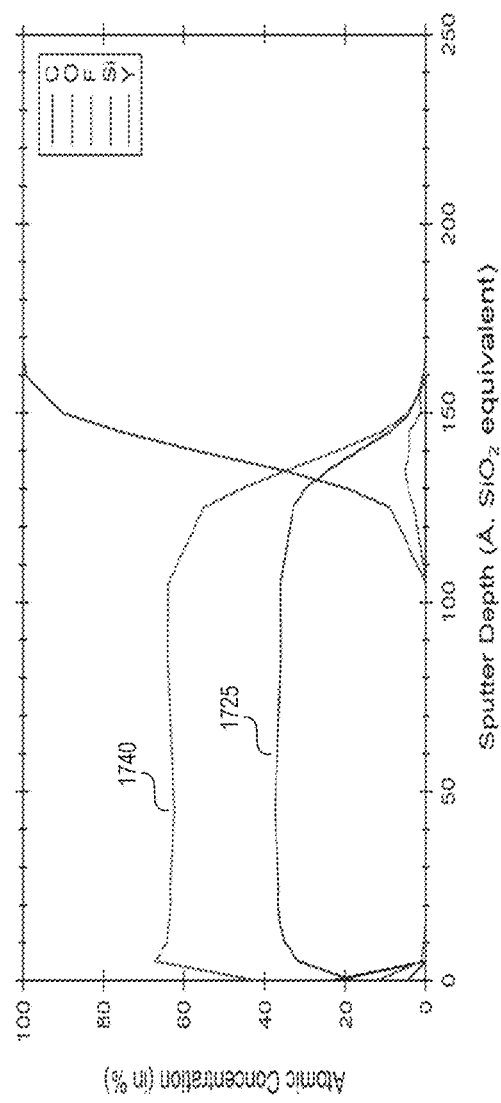
FIG. 17 illustrates an x-ray photoelectron spectroscopy (XPS) surface analysis showing the material composition of a $YF_3$ coating deposited by ALD.

FIG. 17 illustrates an x-ray photoelectron spectroscopy (XPS) surface analysis showing the material composition of a $YF_3$ coating deposited by ALD. As shown, the $YF_3$ coating includes F 1740 and Y 1725 and has a depth of 160 nm.

Figure 18:
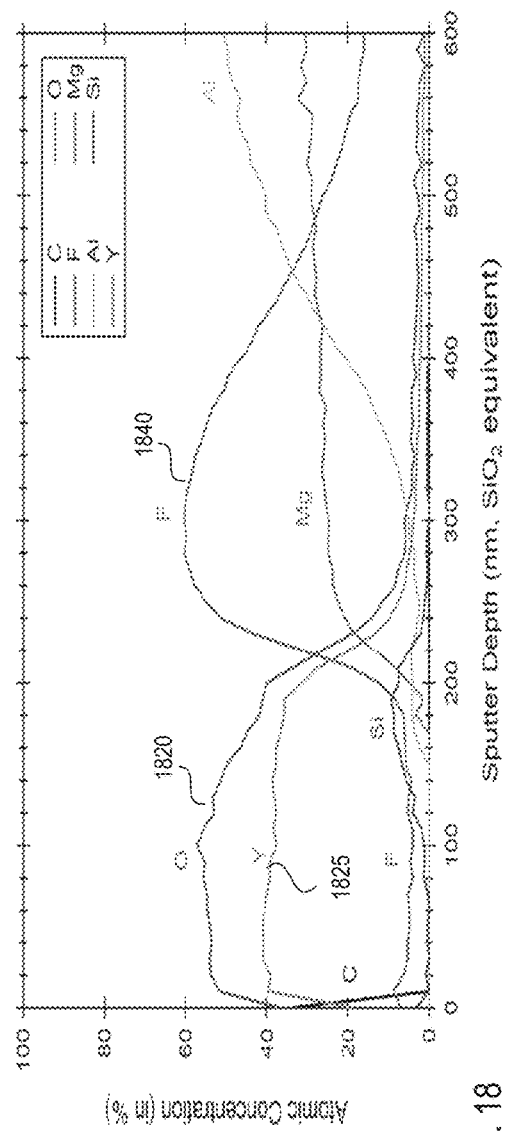
FIG. 18 illustrates an XPS surface analysis showing the material composition of a Y—O—F coating formed from oxidation of the $YF_3$ coating of FIG. 17, according to an embodiment.

FIG. 18 illustrates an XPS surface analysis showing the material composition of a Y—O—F coating formed from oxidation of the $YF_3$ coating of FIG. 17, according to an embodiment. The oxidation process was performed at processing conditions of a microwave O plasma at 50 W of plasma power and at about 350° C. The O plasma was flowed with Ar at a ratio of 1:1. As shown, the oxidation process converted the entire $YF_3$ coating into a Y—O—F coating having an oxygen concentration of about 35-60 at. %.

Figure 19:
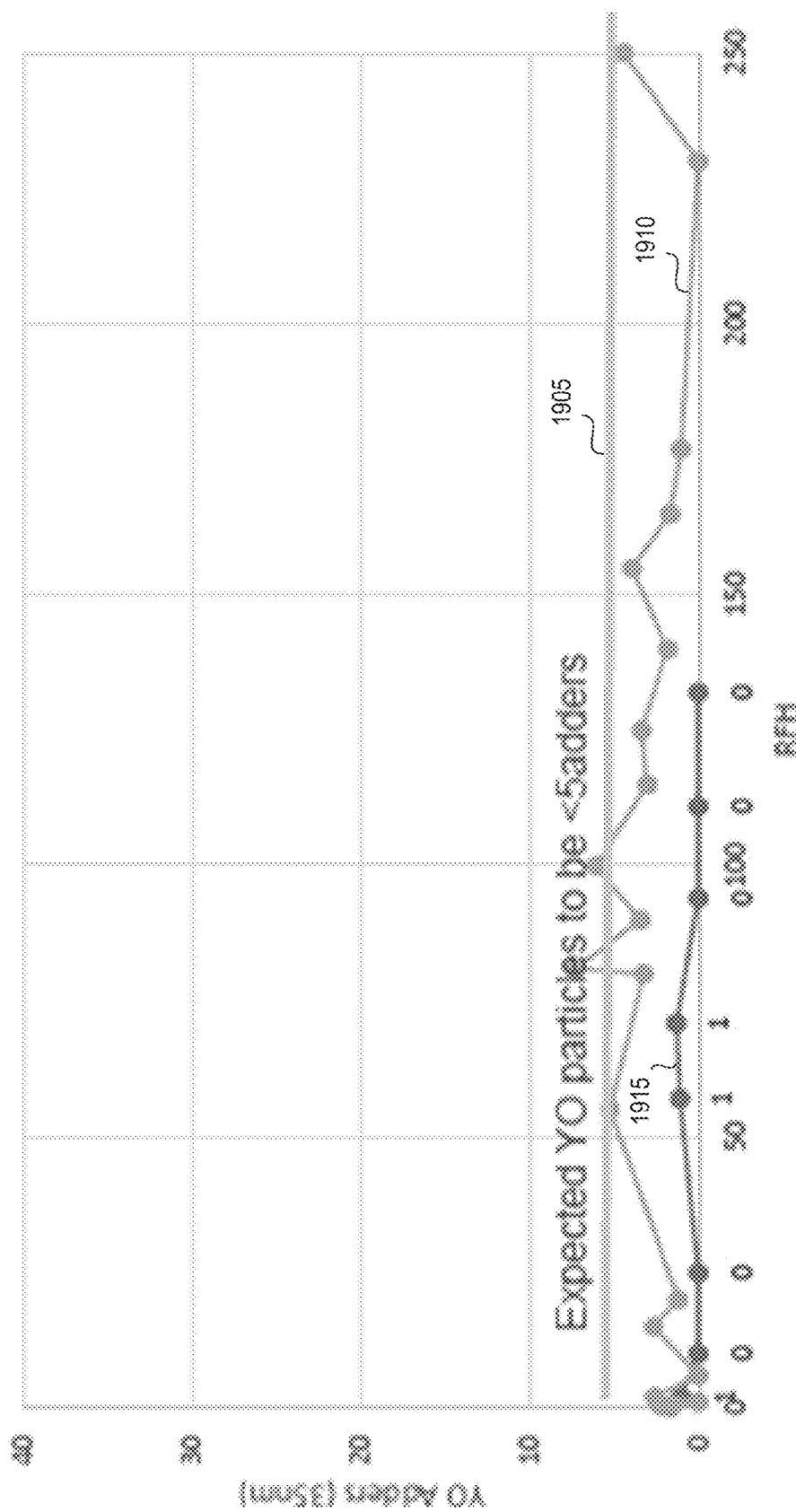
FIG. 19 illustrates particle performance of a Y—O—F coating and a Y—Z—O—F coating.

FIG. 19 is a chart showing $Y_2O_3$ particles detected on a processed substrate on the y-axis and number of radio frequency hours (RFH) on the x-axis. RFH refers to the number of hours of processing under processing conditions. FIG. 19 illustrates a first particle performance 1910 of a first processing chamber that includes a liner with a Y—O—F, a lid that is a composite ceramic comprising a first phase of $Y_4Al_2O_9$ (YAM) and second phase that is a $Y_2O_3$—$ZrO_2$ solid solution, and a quartz nozzle. Also illustrated is a second particle performance 1915 of a second processing chamber that includes a Y—Z—O—F coating on a liner, a lid and a nozzle. As shown, a manufacturer's specification 1905 specifies that there should be fewer than five $Y_2O_3$ particles having a size of 35 nm or larger that are added to substrates that are processed in a processing chamber. The first particle performance 1910 of the first processing chamber exceeded the specification 1905 of 5 adders at around 80-100 radio frequency hours. As shown, the second particle performance 1915 of the second processing chamber is much better than the first particle performance 1910, and is limited to only 1-2 adders at around 60 and 70 radio frequency hours. The Y—Z—O—F coating has been shown to produce remarkably low particle counts on processed substrates, even after 250 radio frequency hours. Moreover, no zirconium based particles (e.g., $ZrO_2$ particles) were detected with use of the Y—Z—O—F coating on the lid, nozzle and liner.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should be determined with reference to the appended claims, along with the full scope of equivalents to which such claims are entitled.

What is claimed is:

1. A method comprising:
    loading a substrate into a processing chamber, the processing chamber comprising one or more chamber components that include a metal oxide coating;
    performing an in-situ fluorination process comprising:
        introducing a fluorine-based plasma from a remote plasma source into the processing chamber at a temperature of room temperature to 800° C. for a time period of 0.5-10 minutes; and
        reacting the metal oxide coating with the fluorine-based plasma to form a temporary M-O—F layer over the metal oxide coating, wherein the temporary M-O—F layer has a thickness of 1-50 nm;
    performing a manufacturing process comprising a corrosive gas on the substrate, wherein the manufacturing process adjusts a thickness of the temporary M-O—F layer, and wherein the temporary M-O—F layer protects the metal oxide coating from the corrosive gas;
    repeating the in-situ fluorination process and the manufacturing process for a plurality of additional substrates;
    determining that an etch back criterion is satisfied; and
    performing an etch back process to remove at least a portion of the temporary M-O—F layer.

2. The method of claim 1, wherein the metal oxide coating is selected from the group consisting of $Al_2O_3$, $Er_2O_3$, $Y_2O_3$, $Y_2O_3$ stabilized $ZrO_2$ (YSZ), $Er_3Al_5O_{12}$ (EAG), a solid solution of $Y_2O_3$—$ZrO_2$, and a composite ceramic comprising $Y_4Al_2O_9$ and a solid solution of $Y_2O_3$—$ZrO_2$.

3. The method of claim 1, wherein the metal oxide coating is selected from the group consisting of:
    a metal oxide coating deposited by plasma spraying, the metal oxide coating having a porosity of about 2-5% and a thickness of about 100-300 μm;
    a metal oxide coating deposited by atomic layer deposition (ALD), the metal oxide coating having a porosity of approximately 0% and a thickness of about 10 nm to about 10 μm;
    a metal oxide coating deposited by electron beam ion assisted deposition (EB-IAD), the metal oxide coating having a porosity of approximately 0% and a thickness of about 1-10 μm; and
    a metal oxide coating deposited by a suspension plasma spray process, the metal oxide coating having a porosity of approximately 1-3% and a thickness of about 50-300 μm.

4. The method of claim 1, wherein the manufacturing process comprising the corrosive gas removes at least a portion of the temporary M-O—F layer without damaging the metal oxide coating.

5. The method of claim 1, further comprising:
    performing optical emission spectroscopy to determine whether the temporary M-O—F layer has reached a target thickness; and
    stopping the etch back process responsive to determining that the temporary M-O—F layer has reached the target thickness.

6. The method of claim 1, wherein determining that the etch back criterion has been satisfied comprises at least one of a) determining that a threshold number of substrates have been processed or b) detecting a threshold amount of particles on a processed substrate.

7. The method of claim 1, wherein the etch back process is performed by flowing at least one of an $SiCl_4$ gas or an $SiCl_4$ plasma into the processing chamber.

8. The method of claim 7, wherein the etch back process is further performed by flowing a $Cl_2$ gas into the processing chamber.

9. The method of claim 7, wherein 1-5 SCCM of at least one of the $SiCl_4$ gas or the $SiCl_4$ plasma is flowed into the processing chamber for a duration of 1-5 seconds.

10. A method comprising:
    performing a fluorination process in a processing chamber comprising one or more chamber components that include a rare earth oxide, the fluorination process comprising:
        introducing a fluorine-based plasma from a remote plasma source into the processing chamber at a temperature of about room temperature to about 800° C. for a time period of 0.5-10 minutes; and
        reacting the rare earth oxide coating with the fluorine-based plasma to form a temporary rare earth oxy-fluoride layer over the rare earth oxide coating, wherein the temporary rare earth oxy-fluoride layer has a thickness of 1-5 nm;
    performing a manufacturing process comprising a corrosive gas, wherein the manufacturing process adjusts a thickness of the temporary rare earth oxy-fluoride layer, and wherein the temporary rare earth oxy-fluoride layer protects the rare earth oxide coating from the corrosive gas;
    repeating the fluorination process and the manufacturing process a plurality of times;
    determining that an etch back criterion is satisfied; and
    performing an etch back process to remove at least a portion of the temporary rare earth oxy-fluoride layer.

11. The method of claim 10, wherein the rare earth oxide coating is selected from the group consisting of $Er_2O_3$, $Y_2O_3$, $Y_2O_3$ stabilized $ZrO_2$ (YSZ), $Er_3Al_5O_{12}$ (EAG), a solid solution of $Y_2O_3$—$ZrO_2$, and a composite ceramic comprising $Y_4Al_2O_9$ and a solid solution of $Y_2O_3$—$ZrO_2$.

12. The method of claim 10, wherein the rare earth oxide coating is selected from the group consisting of:
- a rare earth oxide coating deposited by plasma spraying, the rare earth oxide coating having a porosity of about 2-5% and a thickness of about 100-300 μm;
- a rare earth oxide coating deposited by atomic layer deposition (ALD), the rare earth oxide coating having a porosity of approximately 0% and a thickness of about 10 nm to about 1 μm;
- a rare earth oxide coating deposited by ion assisted deposition (IAD), the rare earth oxide coating having a porosity of approximately 0% and a thickness of about 1-10 μm; and
- a rare earth oxide coating deposited by a suspension plasma spray process, the rare earth oxide coating having a porosity of approximately 1-3% and a thickness of about 50-100 μm.

13. The method of claim 10, wherein the manufacturing process comprising the corrosive gas removes at least a portion of the temporary rare earth oxy-fluoride layer without damaging the rare earth oxide coating.

14. The method of claim 10, wherein determining that the etch back criterion has been satisfied comprises at least one of a) determining that a threshold number of substrates have been processed or b) detecting a threshold amount of particles on a processed substrate.

15. The method of claim 10, wherein the etch back process is performed by flowing at least one of an $SiCl_4$ gas or an $SiCl_4$ plasma into the processing chamber.

16. The method of claim 15, wherein the etch back process is further performed by flowing a $Cl_2$ gas into the processing chamber.

17. A method comprising:
performing a fluorination process in a processing chamber comprising one or more chamber components that include a rare earth oxide, the fluorination process comprising:
- exposing the one or more chamber components in the processing chamber to a fluorine-based acid solution at a temperature of about room temperature to about 100° C. for a time period of 0.5-10 minutes; and
- reacting the rare earth oxide coating with the fluorine-based acid solution to form a temporary rare earth oxy-fluoride layer over the rare earth oxide coating, wherein the temporary rare earth oxy-fluoride layer has a thickness of 1-50 nm;

performing a manufacturing process comprising a corrosive gas, wherein the manufacturing process adjusts a thickness of the temporary rare earth oxy-fluoride layer, and wherein the temporary rare earth oxy-fluoride layer protects the rare earth oxide coating from the corrosive gas;

repeating the fluorination process and the manufacturing process a plurality of times;

determining that an etch back criterion is satisfied; and performing an etch back process to remove at least a portion of the temporary rare earth oxy-fluoride layer.

18. The method of claim 17, wherein the fluorine-based acid solution is an HF acid solution comprising 50-95 vol % water and 0.1-50 vol % HF acid.

* * * * *